(12) United States Patent
Takagi et al.

(10) Patent No.: US 9,905,759 B2
(45) Date of Patent: Feb. 27, 2018

(54) MEMORY DEVICE AND METHOD FOR MANUFACTURING THE SAME

(71) Applicant: Toshiba Memory Corporation, Minato-ku (JP)

(72) Inventors: Takeshi Takagi, Yokkaichi (JP);
Takeshi Yamaguchi, Yokkaichi (JP);
Masaki Yamato, Yokkaichi (JP);
Hiroyuki Ode, Yokkaichi (JP);
Toshiharu Tanaka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/013,088

(22) Filed: Feb. 2, 2016

(65) Prior Publication Data

US 2017/0062713 A1    Mar. 2, 2017

Related U.S. Application Data

(60) Provisional application No. 62/208,999, filed on Aug. 24, 2015.

(51) Int. Cl.
*H01L 45/00* (2006.01)
*H01L 27/24* (2006.01)

(52) U.S. Cl.
CPC ...... *H01L 45/1246* (2013.01); *H01L 27/2427* (2013.01); *H01L 27/2481* (2013.01); *H01L 45/146* (2013.01); *H01L 45/1641* (2013.01); *H01L 45/1666* (2013.01)

(58) Field of Classification Search
None
See application file for complete search history.

(56) References Cited

U.S. PATENT DOCUMENTS

| 8,829,591 | B2 | 9/2014 | Alsmeier |
| 8,987,087 | B2 | 3/2015 | Chien et al. |
| 2011/0317472 | A1* | 12/2011 | Awaya ............... G11C 11/16 365/148 |
| 2013/0122651 | A1* | 5/2013 | Fujii ............... H01L 27/101 438/104 |

FOREIGN PATENT DOCUMENTS

JP    2015-38994 A    2/2015

* cited by examiner

*Primary Examiner* — Hoang-Quan Ho
(74) *Attorney, Agent, or Firm* — Oblon, McClelland, Maier & Neustadt, L.L.P.

(57) ABSTRACT

According to one embodiment, a memory device includes a pillar, a first wiring, a second wiring, an insulating film provided between the first wiring and the second wiring, a first layer provided between the first wiring and the pillar in the second direction and including a first metal oxide containing a first metal and oxygen, a second layer provided between the second wiring and the pillar in the second direction and including the first metal oxide containing the first metal and oxygen, and an intermediate film provided between the pillar and the first layer and between the pillar and the second layer in the second direction and including a second metal oxide containing the first metal and oxygen. Concentration of oxygen contained in the first metal oxide is lower than concentration of oxygen contained in the second metal oxide.

8 Claims, 21 Drawing Sheets

MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/208,999, filed on Aug. 24, 2015; the entire contents of which are incorporated herein by reference.

FIELD

Embodiments described here in relate generally to a memory device and a method for manufacturing the same.

BACKGROUND

A nonvolatile memory device based on a resistance change film has been proposed as a memory device. The resistance change film exhibits a plurality of resistance states relatively different in resistance depending on the magnitude of voltage applied to the resistance change film and the control of application time. The resistance state in response to the application voltage is used to record information.

Improvement in read disturb immunity is required in such memory devices.

DETAILED DESCRIPTION

In general, according to one embodiment, a memory device includes a pillar extending in a first direction, a first wiring apart from the pillar in a second direction crossing the first direction, the first wiring extending in a third direction crossing the first direction and the second direction, a second wiring apart from the first wiring in the first direction and extending in the third direction, an insulating film provided between the first wiring and the second wiring, a first layer provided between the first wiring and the pillar in the second direction and including a first metal oxide containing a first metal and oxygen, a second layer provided between the second wiring and the pillar in the second direction and including the first metal oxide containing the first metal and oxygen, and an intermediate film provided between the pillar and the first layer and between the pillar and the second layer in the second direction and including a second metal oxide containing the first metal and oxygen. Concentration of oxygen contained in the first metal oxide is lower than concentration of oxygen contained in the second metal oxide.

Embodiments of the invention will now be described with reference to the drawings.

(First Embodiment)

Figure 1:
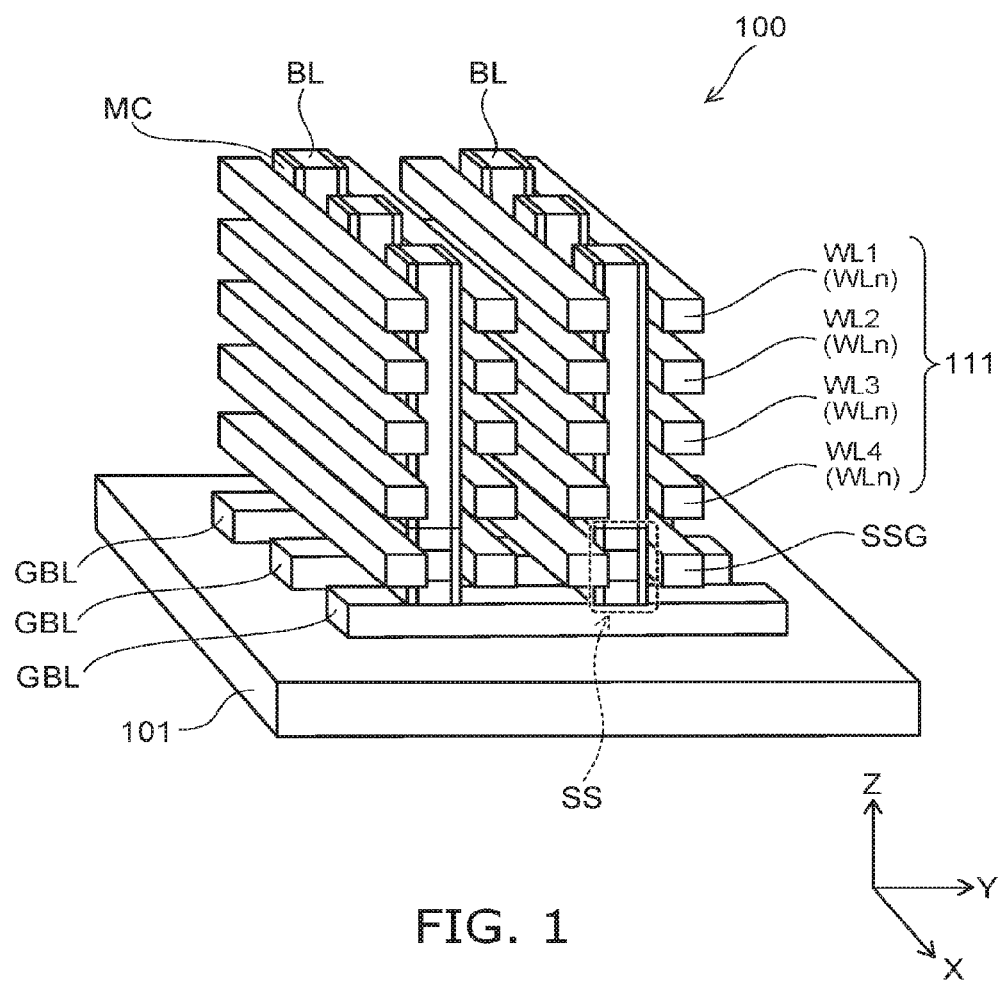
FIG. 1 is a perspective view illustrating a memory device according to a first embodiment.

FIG. 1 is a perspective view illustrating a memory device according to this embodiment.

Figure 2:
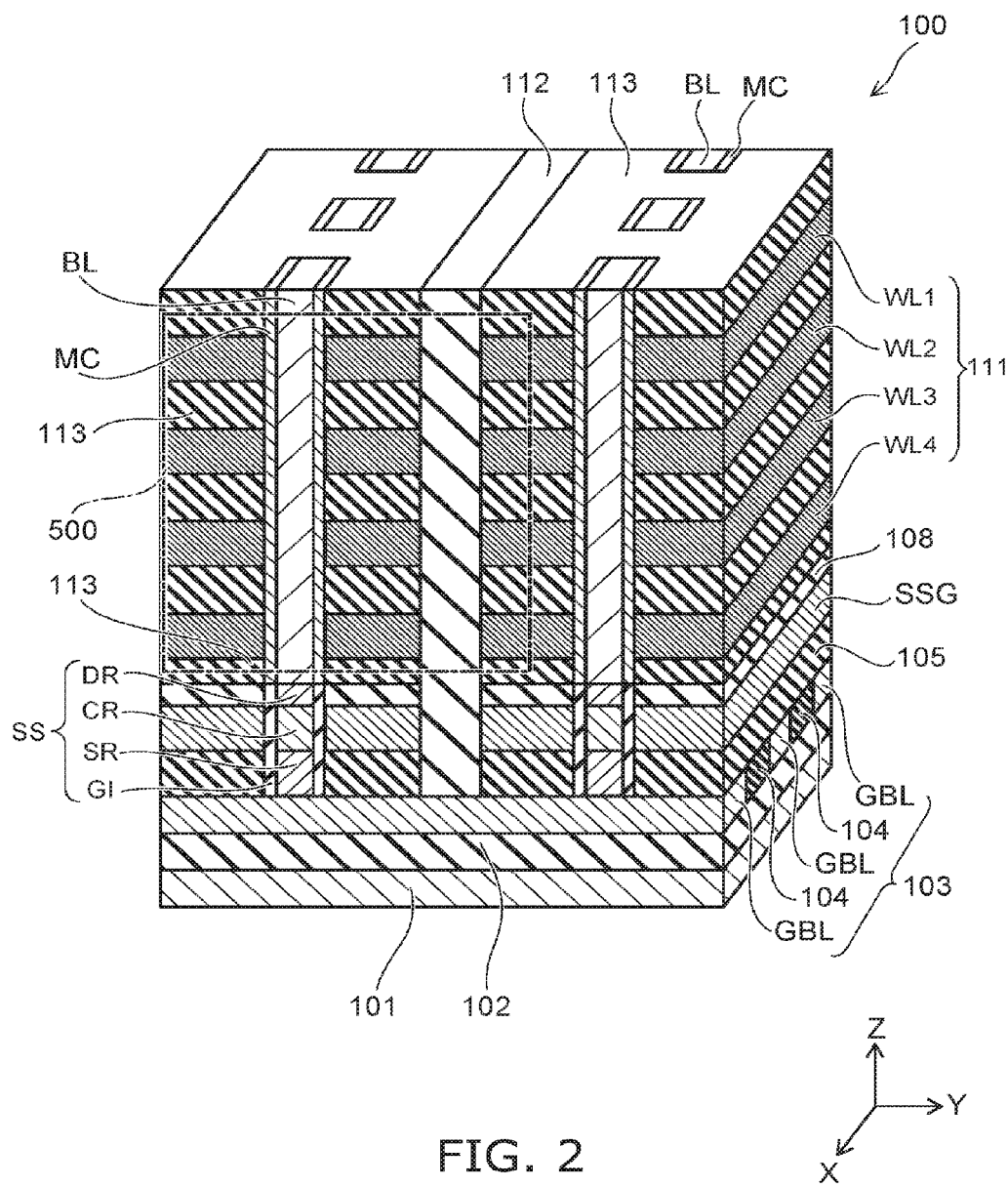
FIG. 2 is a perspective view illustrating the memory device according to the first embodiment.

FIG. 2 is a perspective view illustrating the memory device according to this embodiment.

Figure 3:
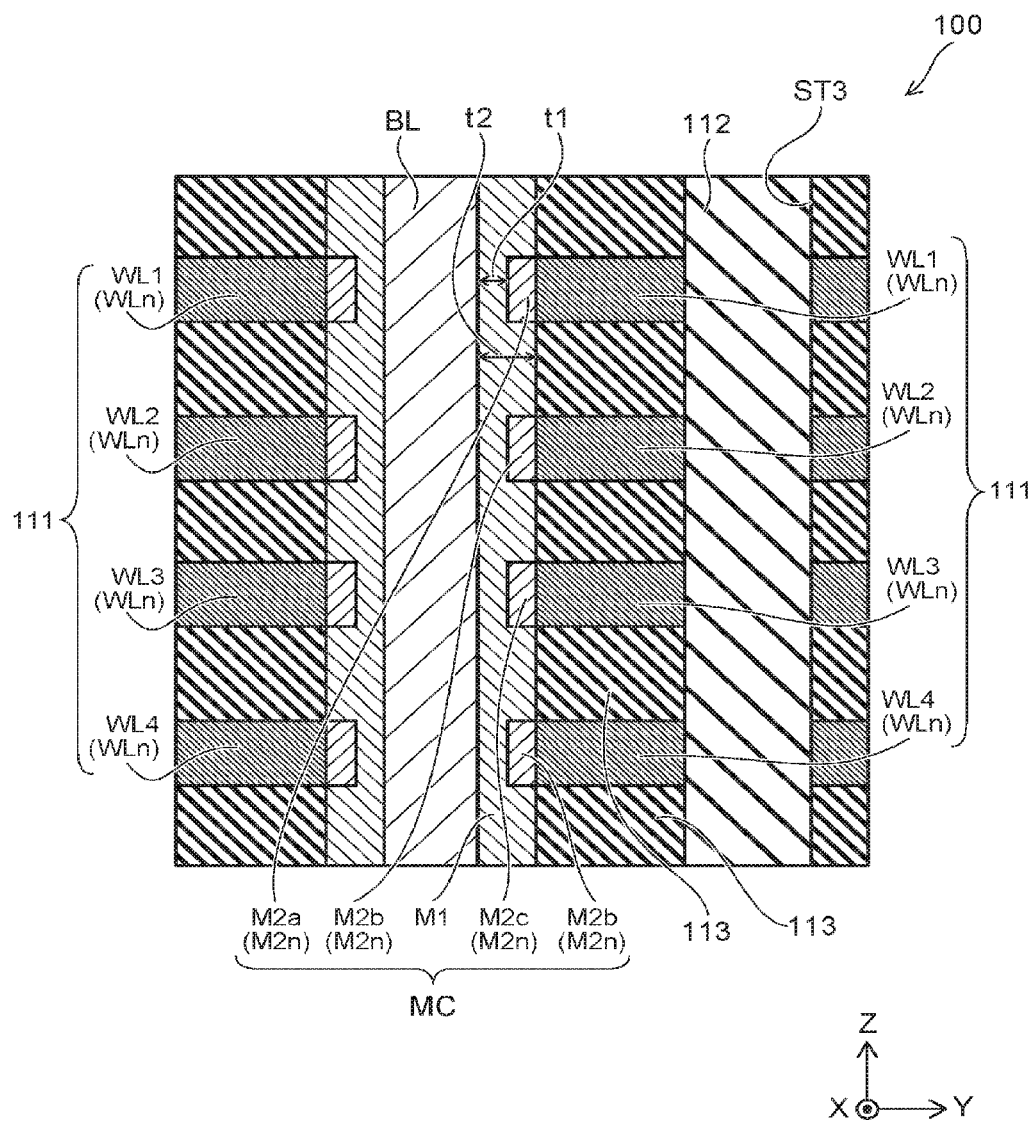
FIG. 3 is a sectional view illustrating region 500 shown in FIG. 2.

FIG. 3 is a sectional view illustrating region 500 shown in FIG. 2.

Figure 4:
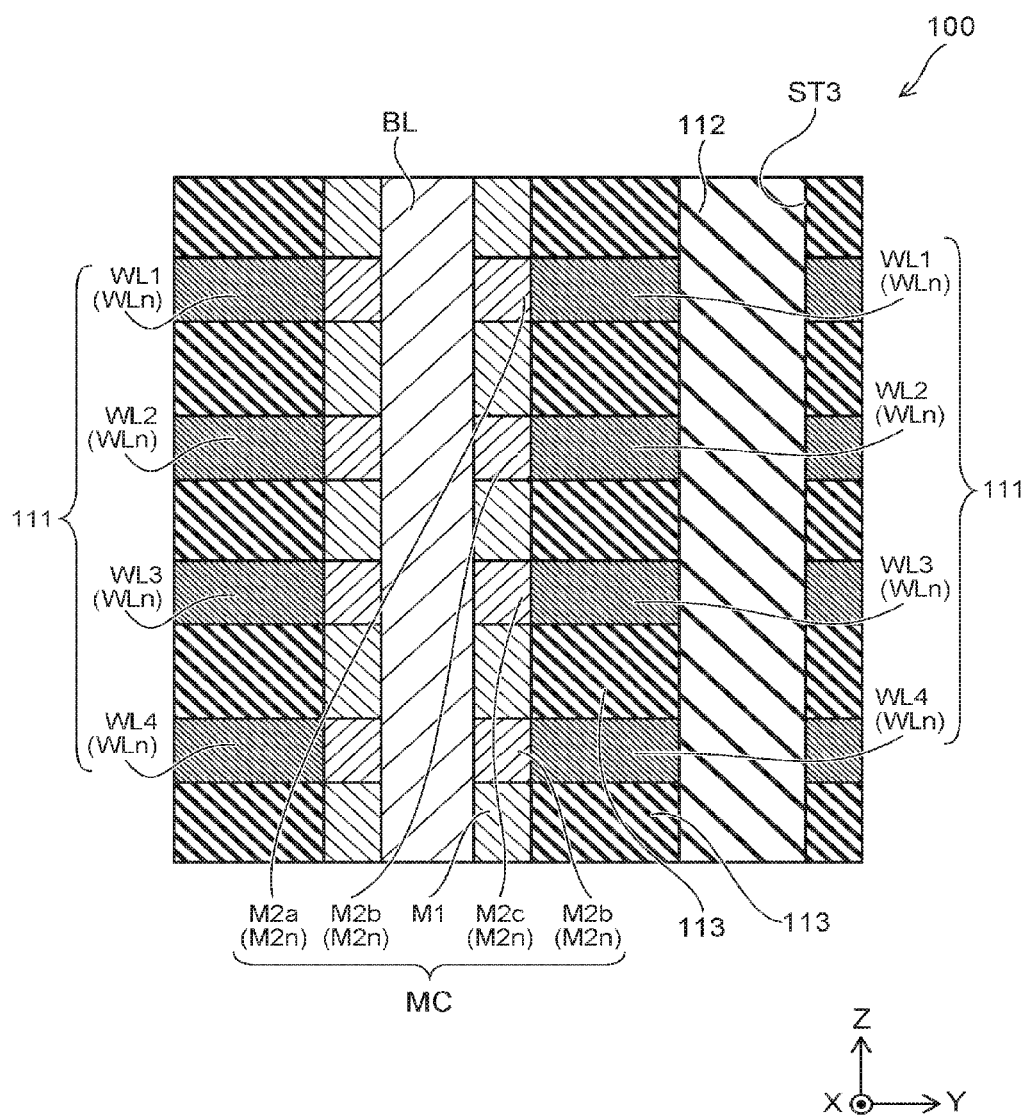
FIG. 4 is a sectional view illustrating the region 500 shown in FIG. 2.

FIG. 4 is a sectional view illustrating the region 500 shown in FIG. 2.

FIG. 4 is a sectional view illustrating an example different from that of the sectional view shown in FIG. 3.

As shown in FIGS. 1 and 2, the memory device 100 according to this embodiment includes a substrate 101.

An interlayer insulating film 102 is provided on the substrate 101. A local bit line BL (e.g., semiconductor pillar), an insulating member 112, and a word line wiring layer 111 are provided on the interlayer insulating film 102.

The local bit line BL extends in a first direction. The first direction is taken as the Z-direction. One axis perpendicular to the Z-direction is taken as the X-direction. The direction perpendicular to the Z-direction and the X-direction is taken as the Y-direction.

The local bit line BL is shaped like e.g. a column. The local bit line BL, the word line wiring layer 111, and the insulating member 112 are arranged in a second direction crossing the first direction. The second direction is e.g. the Y-direction.

The word line wiring layer 111 includes a plurality of word lines WLn. The plurality of word lines WLn extend in a third direction crossing the first direction and the second direction. The third direction is e.g. the X-direction.

The plurality of word lines WLn include e.g. a first word line WL1, a second word line WL2, a third word line WL3, and a fourth word line WL4. In the word line wiring layer 111, the first to fourth word lines WL1-WL4 are provided e.g. in this order from the top and apart from each other along the first direction (Z-direction). In the second direction (Y-direction), the word line wiring layer 111 is placed between the local bit line BL and the insulating member 112.

A resistance change film MC is provided between the local bit line BL and the word line wiring layer 111.

A global bit line wiring layer 103 is provided between the interlayer insulating film 102 and the word line wiring layer 111. The global bit line wiring layer 103 includes a plurality of global bit lines GBL and an insulating film 104. The plurality of global bit lines GBL extend in the second direction (Y-direction). For instance, the plurality of global bit lines GBL are arranged along the third direction (X-direction). The insulating film 104 is provided between the plurality of global bit lines GBL in the third direction (X-direction).

An insulating film 105 is provided between the global bit line wiring layer 103 and the word line wiring layer 111.

A select gate electrode SSG extending in the third direction (X-direction) is provided between the insulating film 105 and the word line wiring layer 111.

An insulating film 108 is provided between the select gate electrode SSG and the word line wiring layer 111.

A select member SS is provided between the global bit line GBL and the local bit line BL. The select member SS is shaped like e.g. a column. The select member SS extends in the first direction (Z-direction) and is electrically connected to the global bit line GBL. The select member SS includes a source portion SR, a channel portion CR, and a drain portion DR. The source portion SR, the channel portion CR, and the drain portion DR are arranged in this order along the Z-direction (e.g., from bottom to top). The select member SS further includes a gate insulating film GI. The gate insulating film GI is provided between the source portion SR and the select gate electrode SSG, between the channel portion CR and the select gate electrode SSG, and between the drain portion DR and the select gate electrode SSG.

In the word line wiring layer 111, an insulating film 113 is provided between the plurality of word lines WLn. The insulating film 113 is provided also between the word line wiring layer 111 and the insulating film 108. Furthermore, the insulating film 113 is provided also on the word line wiring layer 111.

FIG. 1 omits members other than the substrate 101, the global bit line GBL, the select member SS, the select gate electrode SSG, the word line wiring layer 111, the local bit line BL, and the resistance change film MC.

As shown in FIG. 3, the resistance change film MC includes a first intermediate film M1 and a plurality of second intermediate films M2$n$.

The first intermediate film M1 includes e.g. metal oxide. The plurality of second intermediate films M2$n$ include e.g. oxygen-deficient metal oxide.

The plurality of second intermediate films M2$n$ include e.g. a first metal oxide layer M2$a$ (first layer), a second metal oxide layer M2$b$ (second layer), a third metal oxide layer M2$c$, and a fourth metal oxide layer M2$d$.

The first intermediate film M1 is provided along the first direction (Z-direction) between the local bit line BL and the word line wiring layer 111. A plurality of second intermediate films M2$n$ are placed between the first intermediate film M1 and the word line wiring layer 111. More specifically, the first metal oxide layer M2$a$ is placed between the first intermediate film M1 and the first word line WL1. The second metal oxide layer M2$b$ is placed between the first intermediate film M1 and the second word line WL2. The third metal oxide layer M2$c$ is placed between the first intermediate film M1 and the third word line WL3. The fourth metal oxide layer M2$d$ is placed between the first intermediate film M1 and the fourth word line WL4.

In the first direction (Z-direction), the plurality of second intermediate films M2$n$ are discontinuous and separated from each other. For instance, the first metal oxide layer M2$a$ (first layer) placed between the first intermediate film M1 and the first word line WL1 is not in contact with the second metal oxide layer M2$b$ (second layer) placed between the first intermediate film M1 and the second word line WL2. One word line WLn and one second intermediate film M2$n$ are arranged along the second direction (Y-direction).

The first intermediate film M1 includes e.g. a resistance change material such as hafnium oxide.

The first intermediate film M1 may include one or more resistance change materials selected from the group consisting of hafnium oxide, titanium oxide, tantalum oxide, zirconium oxide, and nickel oxide.

The plurality of second intermediate films M2$n$ include e.g. oxygen-deficient metal oxide such as oxygen-deficient hafnium oxide. The oxygen content of oxygen-deficient metal oxide is lower than the composition of the metal oxide having the stoichiometric composition. For instance, the oxygen concentration in the second intermediate film M2$n$ is lower than the oxygen concentration in the first intermediate film M1. The amount of oxygen defects per unit volume in the second intermediate film M2$n$ is larger than the amount of oxygen defects per unit volume in the first intermediate film Ml. For instance, the oxygen defect density per unit volume in the second intermediate film M2$n$ is higher than the oxygen defect density per unit volume in the first intermediate film M1.

The amount of oxygen defects per unit volume corresponds to e.g. the degree of oxygen deficiency.

The degree of oxygen deficiency can be evaluated by e.g. XPS (X-ray photoelectron spectroscopy) or EELS (electron energy-loss spectroscopy).

The second intermediate film M2$n$ may include one or more oxygen-deficient metal oxides selected from the group consisting of oxygen-deficient hafnium oxide, oxygen-deficient titanium oxide, oxygen-deficient tantalum oxide, oxygen-deficient zirconium oxide, and oxygen-deficient nickel oxide.

The thickness (first thickness t1) of the first intermediate film M1 between the word line WLn and the local bit line BL is thinner than the thickness (second thickness t2) of the first intermediate film M1 between the insulating film 113 and the local bit line BL. These thicknesses of the first intermediate film M1 are lengths in the second direction (Y-direction) of the first intermediate film M1.

As shown in FIG. 4, the thickness (first thickness t1) of the first intermediate film M1 between the word line WLn and the local bit line BL may be zero. That is, the first intermediate film M1 may be provided between the insulating film 113 and the local bit line BL, and may not be provided between the word line WLn and the local bit line BL.

Next, an example of the operation of the memory device according to this embodiment is described.

The resistance change film MC (the first intermediate film M1 and the plurality of second intermediate films M2$n$) assumes either the low-resistance state (set state) or the high-resistance state (reset state) in response to the applied voltage. The resistance (electrical resistance) of the resistance change film MC in the low-resistance state is lower than the resistance (electrical resistance) in the high-resistance state.

For instance, a reset voltage is applied to the resistance change film MC in the low-resistance state (set state) through the word line WLn and the local bit line BL. This switches the resistance change film MC to the high-resistance state (reset state). On the other hand, a set voltage higher than the reset voltage is applied to the resistance change film MC in the high-resistance state (reset state). This switches the resistance change film MC to the low-resistance state (set state).

In the memory device 100 according to this embodiment, for instance, when applying the reset voltage, a first voltage is applied to the local bit line BL, and a second voltage is applied to a particular word line of the plurality of word lines WLn. The first voltage is higher than the second voltage. Then, a current flows from the local bit line BL applied with the first voltage toward the word line applied with the second voltage. On the other hand, when applying the set voltage, a third voltage is applied to the local bit line BL, and a fourth voltage is applied to the word line. The third voltage is lower than the fourth voltage. Then, a current flows from the word line applied with the fourth voltage toward the local bit line BL applied with the third voltage.

In this embodiment, as shown in FIG. 3, a plurality of second intermediate films M2n are provided between the first intermediate film M1 and the word line wiring layer 111. The plurality of second intermediate films M2n have a lower resistance value than the first intermediate film M1. The plurality of second intermediate films M2n are provided discontinuously along the first direction (Z-direction). This can suppress short circuit between the word lines WLn in the first direction (Z-direction). Furthermore, read disturb can be suppressed.

Furthermore, the thickness in the second direction (Y-direction) of the first intermediate film M1 between the word line WLn and the local bit line BL is thinner than the thickness in the second direction (Y-direction) of the first intermediate film M1 between the insulating film 113 and the local bit line BL. This stably forms a filament in the portion of the first intermediate film M1 having a thin thickness, i.e., in the first intermediate film M1 between the particular word line WLn and the local bit line BL.

Next, an example of a method for manufacturing the memory device according to this embodiment is described.

FIGS. 5 to 9 are perspective views illustrating the method for manufacturing the memory device according to the first embodiment.

FIGS. 10 to 16 are process sectional views illustrating the method for manufacturing the memory device according to the first embodiment.

Figure 9:
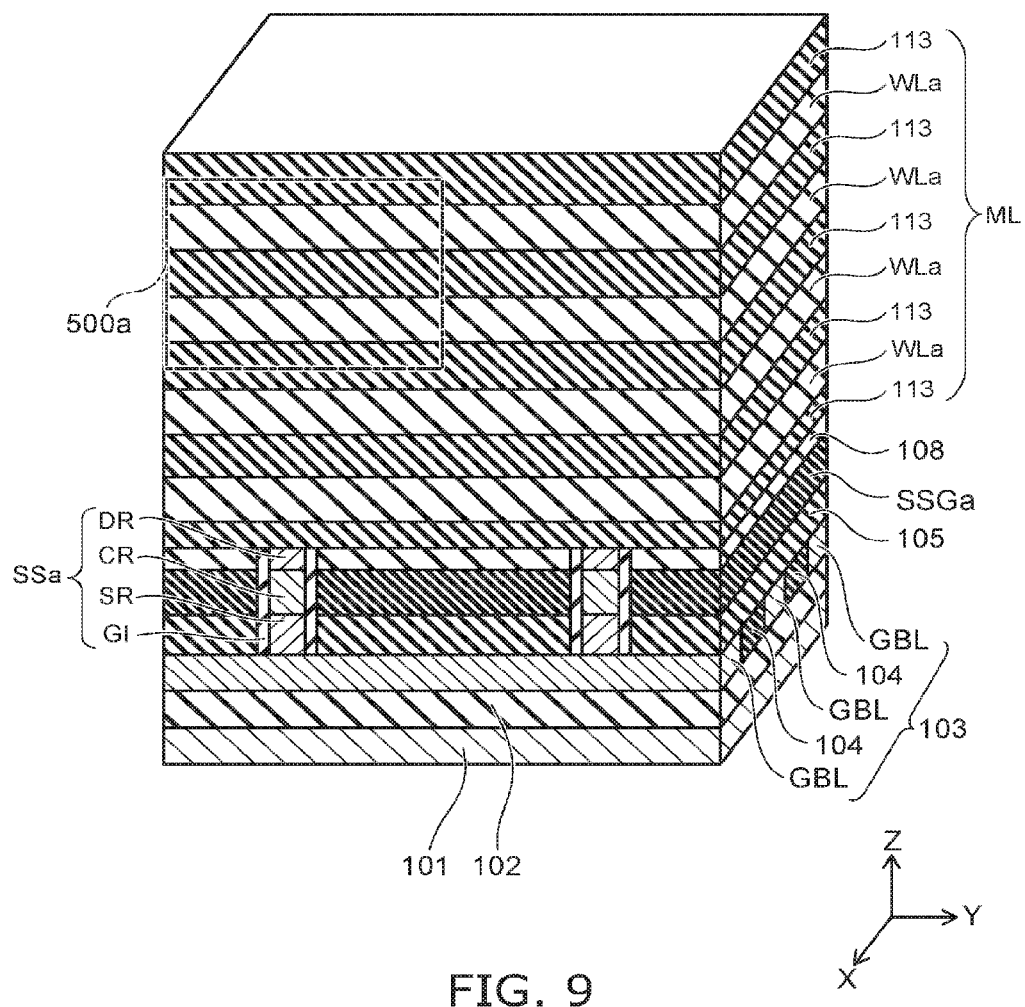

FIGS. 10 to 16 show a region corresponding to region 500a shown in FIG. 9.

Figure 5:
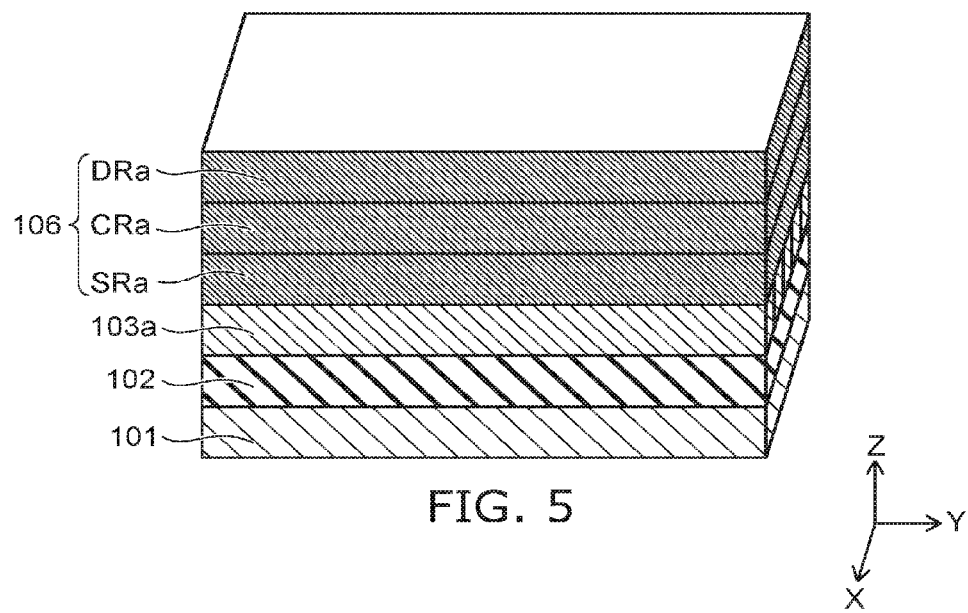
FIGS. 5 to 9 are perspective views illustrating the method for manufacturing the memory device according to the first embodiment.

As shown in FIG. 5, an interlayer insulating film 102 is formed on a substrate 101. A conductive film 103a is formed on the interlayer insulating film 102.

A first silicon layer SRa, a second silicon layer CRa, and a third silicon layer DRa are stacked in this order on the conductive film 103a. Thus, a stacked film 106 is formed.

For instance, the first silicon layer SRa is an $n^+$-type silicon layer. The second silicon layer CRa is a $p^-$-type silicon layer. The third silicon layer DRa is an $n^+$-type silicon layer.

Figure 6:
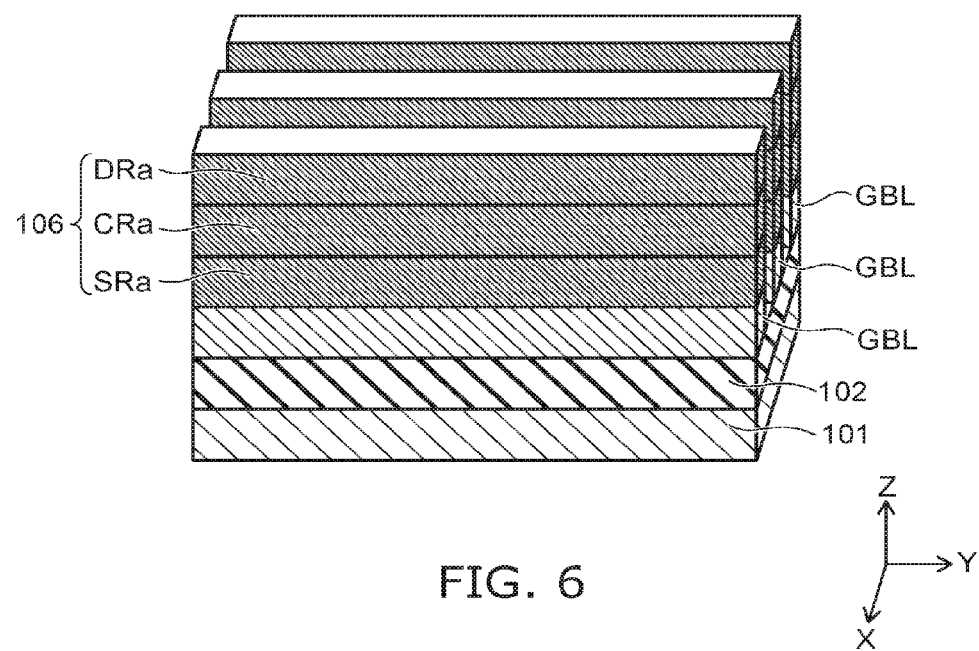

As shown in FIG. 6, the conductive film 103a and the stacked film 106 are patterned by a processing technique such as photolithography. Thus, the conductive film 103a is processed into a plurality of global bit lines GBL extending in the second direction (Y-direction). The global bit lines GBL are apart from each other. At this time, the stacked film 106 is also processed into stripes along the Y-direction.

Figure 7:
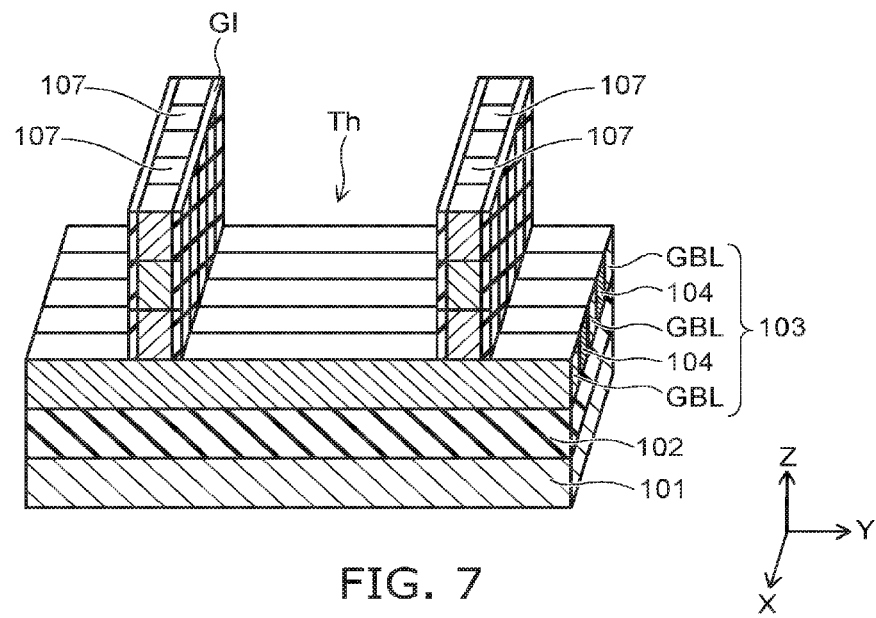

Then, as shown in FIG. 7, an insulating material is deposited on the entire surface. Then, the upper surface of the third silicon layer DRa of the stacked film 106 is exposed by planarization treatment such as CMP (chemical mechanical polishing). Thus, an insulating layer 104 is formed between the global bit lines GBL. As a result, a global bit line wiring layer 103 including the global bit lines GBL and the insulating film 104 is formed. At this time, an insulating film 107 is also formed between the stacked films 106 processed into stripes.

The stacked film 106 and the insulating film 107 are patterned into stripes along the X-direction by a processing technique such as photolithography. At this time, the upper surface of the global bit line GBL and the upper surface of the insulating film 104 are exposed at the bottom of the formed trench part Th.

By the aforementioned two iterations of patterning, the stacked film 106 is divided along the X-direction and the Y-direction. Thus, the stacked film 106 is processed into a plurality of columnar bodies. In each columnar body, the first silicon layer SRa constitutes a source portion SR. The second silicon layer CRa constitutes a channel portion CR. The third silicon layer DRa constitutes a drain portion DR.

An insulating film is formed on the entire surface. Then, by etch-back, the insulating film is left only on the side surface of the trench part Th. Thus, a gate insulating film GI is formed on the side surface of the trench part Th. Accordingly, a select member SS is formed from the gate insulating film GI and the columnar body including the source portion SR, the channel portion CR, and the drain portion DR.

Figure 8:
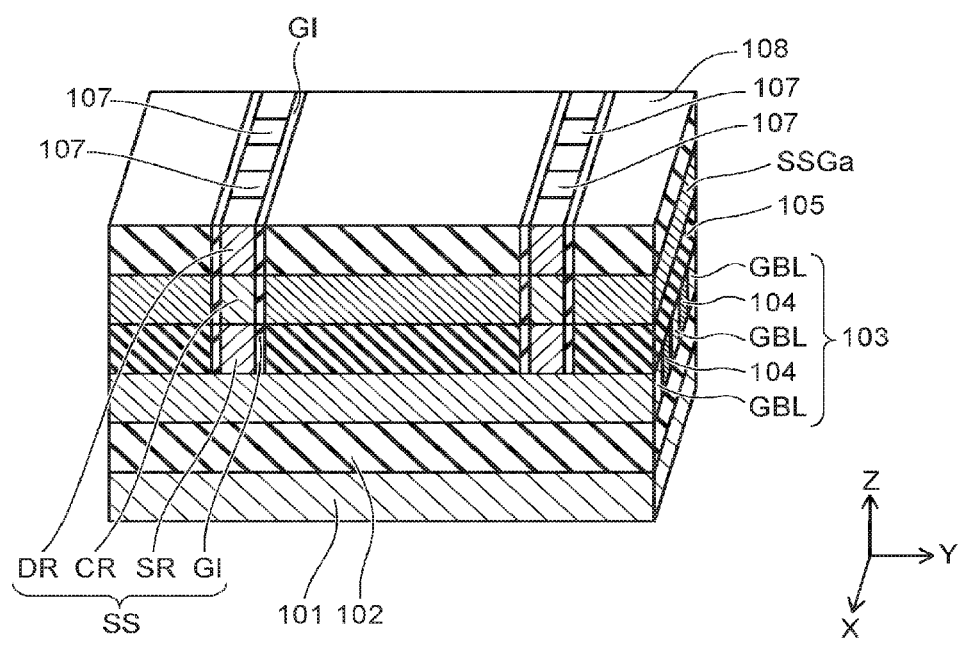

As shown in FIG. 8, an insulating material is deposited on the entire surface, and then subjected to etching treatment. Thus, an insulating film 105 is formed at the bottom of the trench part Th. At this time, the upper surface of the insulating film 105 is formed nearly at the same position in the Z-direction as the interface between the source portion SR and the channel portion CR.

A conductive material is deposited on the entire surface, and then subjected to etching treatment. Thus, a select gate electrode SSG is formed on the insulating film 105. The upper surface of the select gate electrode SSG is formed nearly at the same position in the Z-direction as the interface between the channel portion CR and the drain portion DR.

An insulating material is deposited on the entire surface, and then subjected to etching treatment. Thus, an insulating film 108 is formed on the select gate electrode SSG. The upper surface of the insulating film 108 is formed nearly at the same position in the Z-direction as the upper surface of the drain portion DR.

Then, as shown in FIG. 9, a plurality of insulating films 113 and a plurality of sacrificial films WLa (first films) are stacked alternately one by one on the insulating film 108. Thus, a stacked body ML including a plurality of insulating films 113 and a plurality of sacrificial films WLa is formed on the insulating film 108. For instance, the insulating film 113 is formed from a material including silicon oxide. The sacrificial film WLa is formed from a material including silicon nitride.

Figure 10:
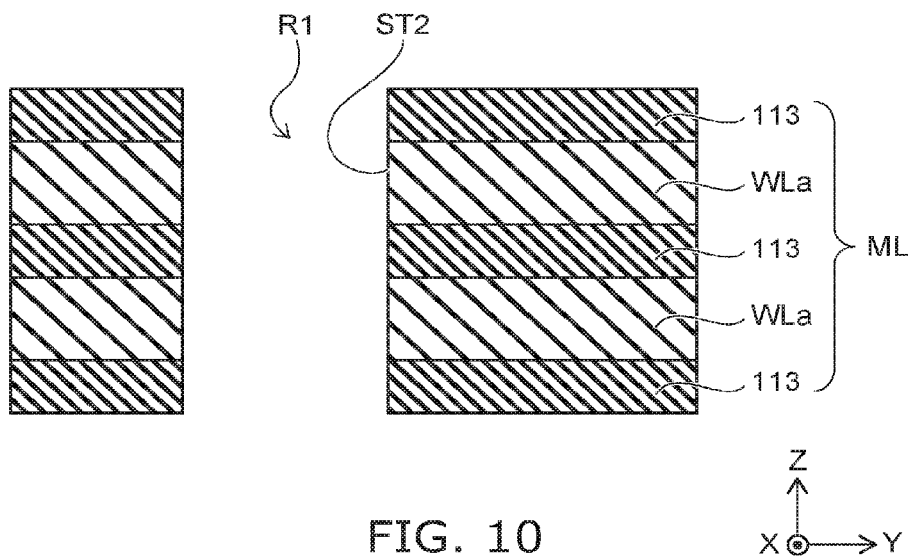
FIGS. 10 to 16 are process sectional views illustrating the method for manufacturing the memory device according to the first embodiment.

Then, as shown in FIG. 10, a slit ST2 is formed in a portion R1 of the stacked body ML directly above the select member SSa. The slit ST2 penetrates through the stacked body ML. Although not shown, the slit ST2 is extended to the upper surface of the select member SSa. The slit ST2 is shaped like a trench extending along the along the third direction (X-direction). That is, the width in the second direction (Y-direction) of the slit ST2 is narrower than the width in the third direction (X-direction).

Figure 11:
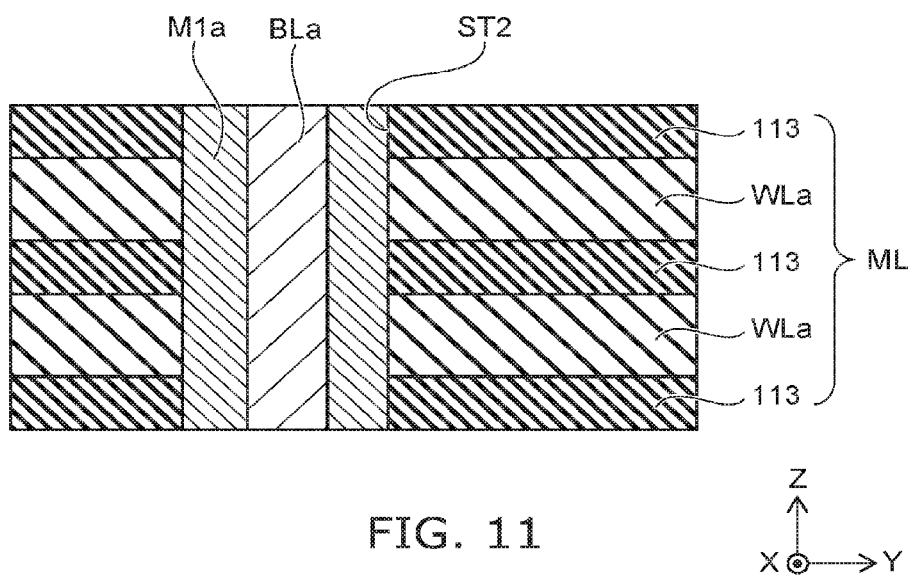

Then, as shown in FIG. 11, a resistance change material such as hafnium oxide is deposited. Then, etch-back treatment is performed. Thus, the resistance change material deposited on the stacked body ML and the bottom of the slit ST2 is removed. At this time, the resistance change material is left on the exposed surface of the stacked body ML in the slit ST2. The resistance change material left in the slit ST2 constitutes a first intermediate film M1a.

The first intermediate film M1a may include one or more resistance change materials selected from the group consisting of hafnium oxide, titanium oxide, tantalum oxide, zirconium oxide, and nickel oxide.

Then, a semiconductor material such as polysilicon is embedded in the slit ST2. Thus, a local bit line BLa is formed. The local bit line BLa is electrically connected to the select member SSa. At this time, the local bit line BLa and the select member SSa are shaped like a plate extending along the third direction (X-direction). That is, the width in the second direction (Y-direction) of the local bit line BL is narrower than the width in the third direction (X-direction). The width in the second direction (Y-direction) of the select member SSa is narrower than the width in the third direction (X-direction). At this time, the local bit line BLa and the select member SSa are electrically connected to a plurality of global bit lines GBL. The first intermediate film M1a, the local bit line BLa, and the select member SSa each include a portion directly above the insulating film 104.

Then, for instance, the portion of the local bit line BLa and the select member SSa directly above the insulating film 104 is removed by anisotropic etching such as RIE (reactive ion etching). At this time, the portion of the local bit line BLa and the select member SSa not directly above the insulating film 104 is not removed. Accordingly, a columnar recess is formed. Thus, the local bit line BLa and the select member SSa extending along the third direction (X-direction) are divided and processed into columnar local bit lines BL and select members SS. By this processing, a local bit line BL is electrically connected to one of the global bit lines GBL through a select member SS. Then, an insulating material including silicon oxide is embedded in the columnar recess. This insulating material constitutes part of the insulating film 113.

Figure 12:
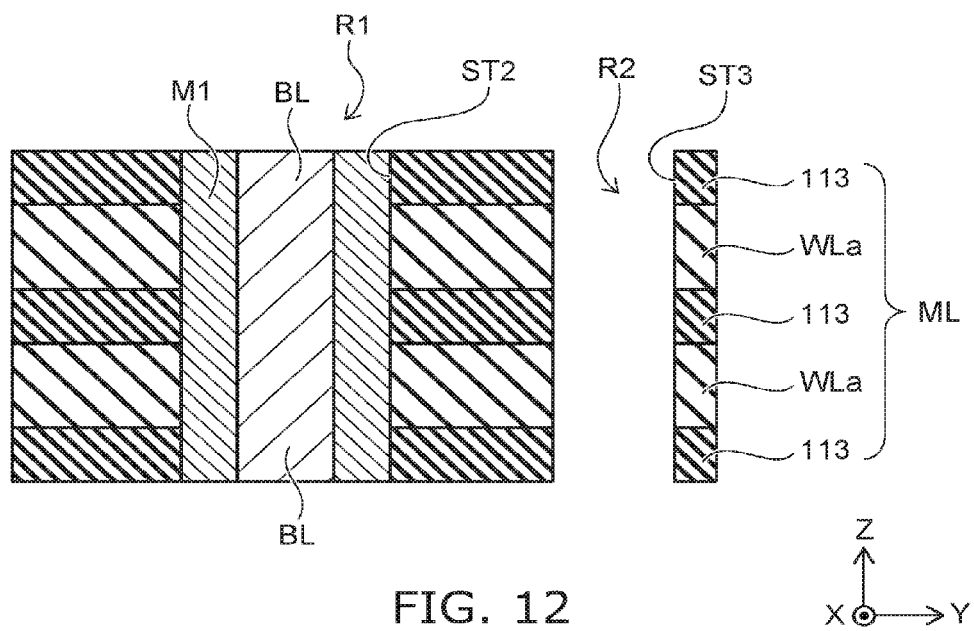

Then, as shown in FIG. 12, a slit ST3 is formed in a portion R2 of the stacked body ML different from the portion R1 where the slit ST2 is formed. The slit ST3 penetrates through the stacked body ML, the insulating film 108, the sacrificial film SSGa, and the insulating film 105. The slit ST3 is shaped like a trench extending along the third direction (X-direction). That is, the width in the second direction (Y-direction) of the slit ST3 is narrower than the width in the third direction (X-direction).

Figure 13:
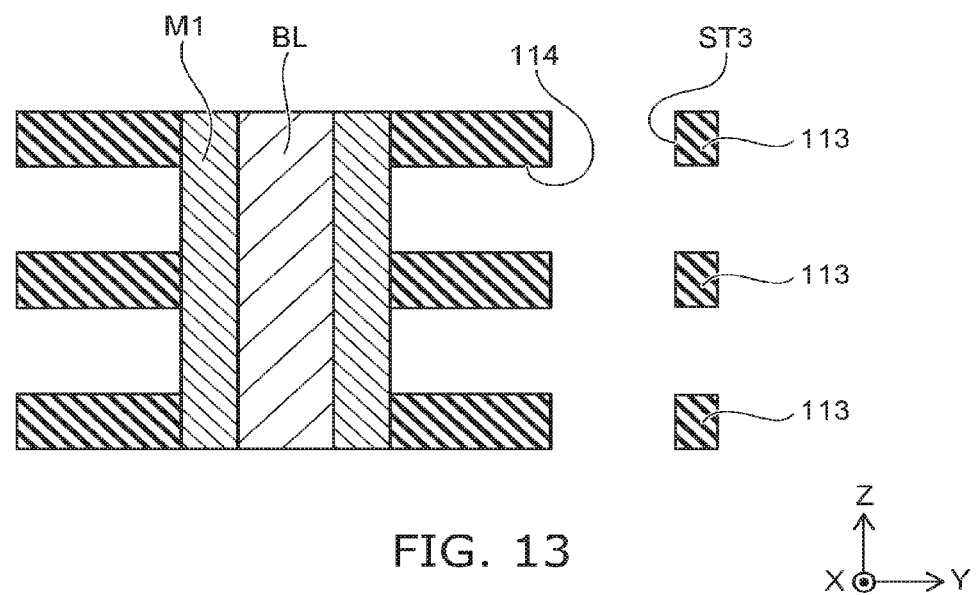

Then, as shown in FIG. 13, the sacrificial film WLa is removed by e.g. wet etching with a liquid such as hot phosphoric acid through the slit ST3. Thus, a void 114 is formed in the region formed by the removal of the sacrificial film WLa. Part of the first intermediate film M1 is exposed in this void 114.

Figure 14:
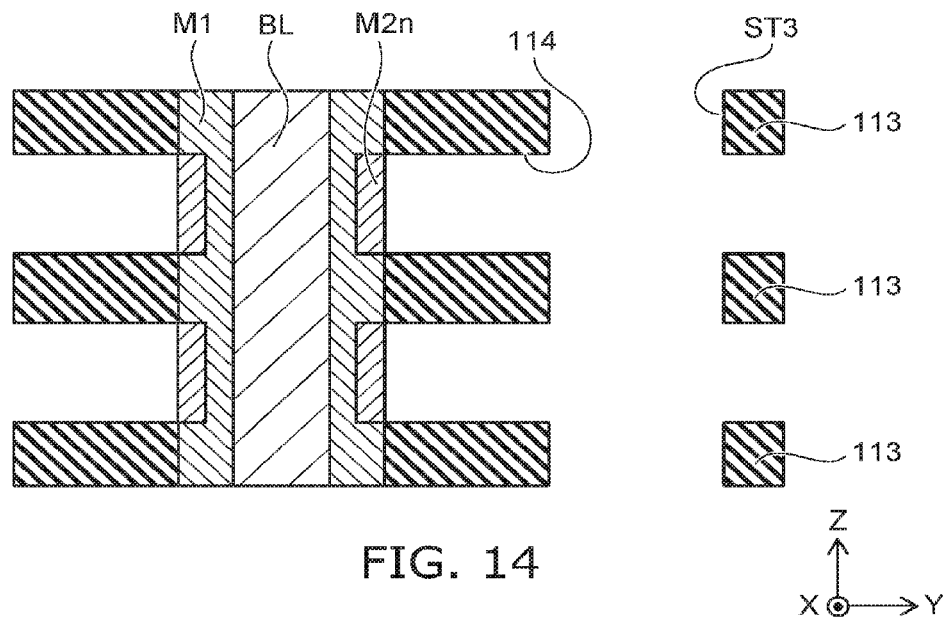

Then, as shown in FIG. 14, reduction treatment is performed on the portion including the exposed surface of the first intermediate film M1 through the slit ST3 and the void 114. In this reduction treatment, for instance, hydrogen is used. This decreases the oxygen concentration of the portion of the first intermediate film M1 subjected to the reduction treatment. The amount of oxygen deficiency per unit volume increases in the portion of the first intermediate film M1 subjected to the reduction treatment (the portion with decreased oxygen concentration). For instance, the oxygen defect density per unit volume increases in the portion of the first intermediate film M1 subjected to the reduction treatment (the portion with decreased oxygen concentration). The portion of the first intermediate film M1 with decreased oxygen concentration constitutes a second intermediate film M2n. That is, the second intermediate film M2n is formed in the portion including the exposed surface of the first intermediate film M1 in each void 114.

Thus, the first intermediate film M1 and the second intermediate film M2n form a resistance change film MC. At this time, the reduction treatment is performed under the condition that the first intermediate film M1 remains between the second intermediate film M2n and the local bit line BL.

Figure 15:
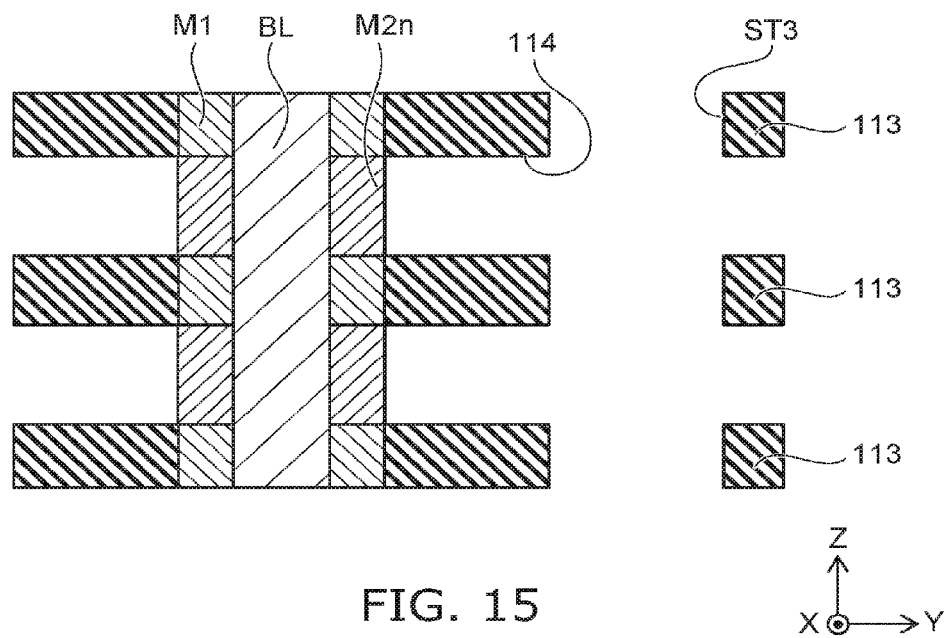

Alternatively, as shown in FIG. 15, reduction treatment may be performed under the condition that the first intermediate film M1 does not remain between the second intermediate film M2n and the local bit line BL.

The second intermediate film M2n is formed from oxygen-deficient metal oxide such as oxygen-deficient hafnium oxide. The second intermediate film M2n may be formed from one or more oxygen-deficient metal oxides selected from the group consisting of oxygen-deficient hafnium oxide, oxygen-deficient titanium oxide, oxygen-deficient tantalum oxide, oxygen-deficient zirconium oxide, and oxygen-deficient nickel oxide.

Figure 16:
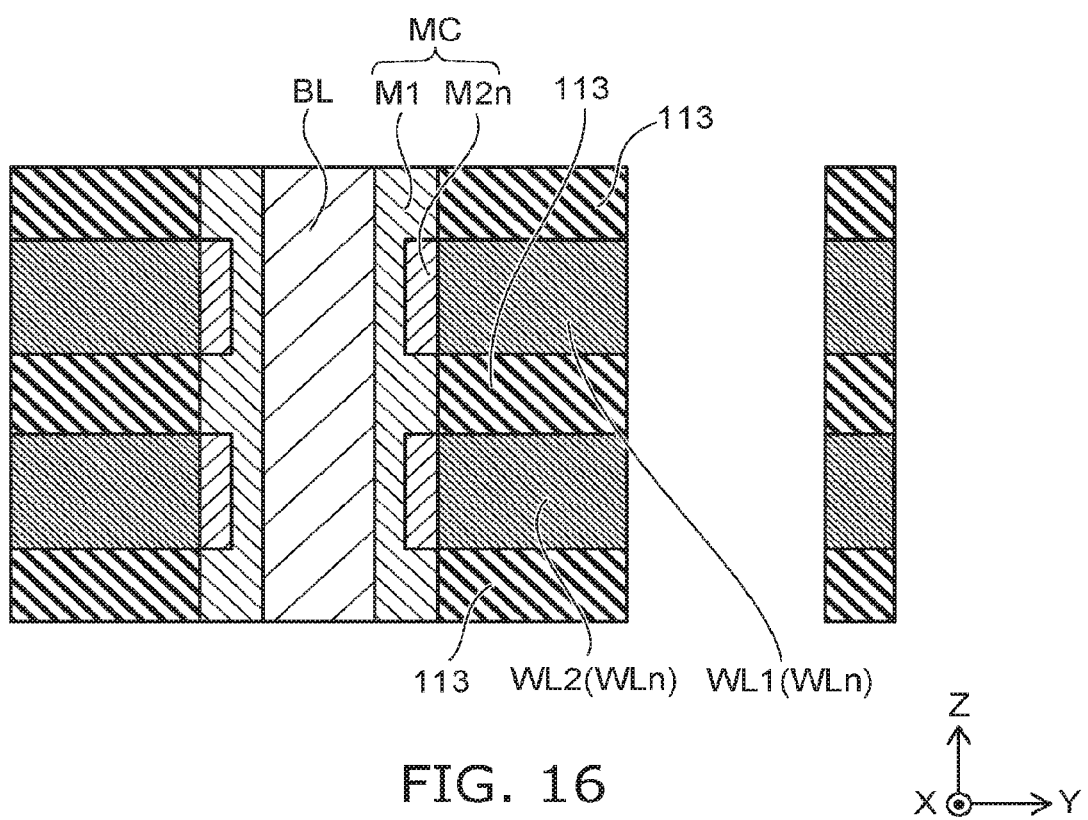

Then, as shown in FIG. 16, a conductive material such as tungsten is deposited in each void 114 through the slit ST3. Thus, a word line WLn is formed in each void 114.

Then, as shown in FIG. 3, an insulating material such as silicon oxide is embedded in the slit ST3. Thus, an insulating member 112 is formed in the slit ST3.

The memory device 100 according to this embodiment is manufactured by the process of the foregoing example. According to this method, the plurality of second intermediate films M2n can be made discontinuous along the first direction (Z-direction).

In the reference example described later, a layer including oxygen-deficient metal oxide is formed by ALD (atomic layer deposition) in the slit ST2. Then, a layer including metal oxide is formed. In this case, oxygen is generated when the layer including metal oxide is formed. This oxygen may oxidize the oxygen-deficient metal oxide layer formed previously.

In this embodiment, the second intermediate film M2n is formed without using ALD, which is difficult of composition control. That is, the second intermediate film M2 is formed by performing reduction treatment on part of the first intermediate film M1. This can easily form a two-layer structure of the first intermediate film M1 and the second intermediate film M2n.

Furthermore, in the embodiment, the memory device 100 according to this embodiment may be formed using a manufacturing facility used to form other three-dimensionally stacked semiconductor memory devices. More specifically, the latter semiconductor memory device includes a stacked body in which conductive films and insulating films are alternately stacked. A memory cell is placed at each intersection point of a semiconductor pillar penetrating through the stacked body. This embodiment can utilize the manufacturing facility of the latter semiconductor memory device.

There is known a reference example in which a plurality of second intermediate films M2n are continuous along the first direction (Z-direction). In this case, in the manufacturing process, a layer including oxygen-deficient metal oxide is formed in the slit ST2. Then, a layer including metal oxide is formed. The layer including oxygen-deficient metal oxide and the layer including metal oxide form a resistance change film. At this time, the layer including oxygen-deficient metal oxide is provided continuously along the first direction (Z-direction) on the side surface of the local bit line BL. In this case, oxygen is generated when the layer including metal oxide is formed. This oxygen may oxidize the oxygen-deficient metal oxide layer formed previously. This makes it difficult to control the composition of the resistance change film. Furthermore, in the reference example, the layer including oxygen-deficient metal oxide between one word line and the local bit line is continuous with the layer including oxygen-deficient metal oxide between another word line and the local bit line. The layer including oxygen-deficient metal oxide has a lower resistance than the layer including metal oxide. Thus, short circuit may occur between the word lines WL through the layer including oxygen-deficient metal oxide. Furthermore, in the reference example, read disturb may occur due to interference between the word lines.

Figure 17:
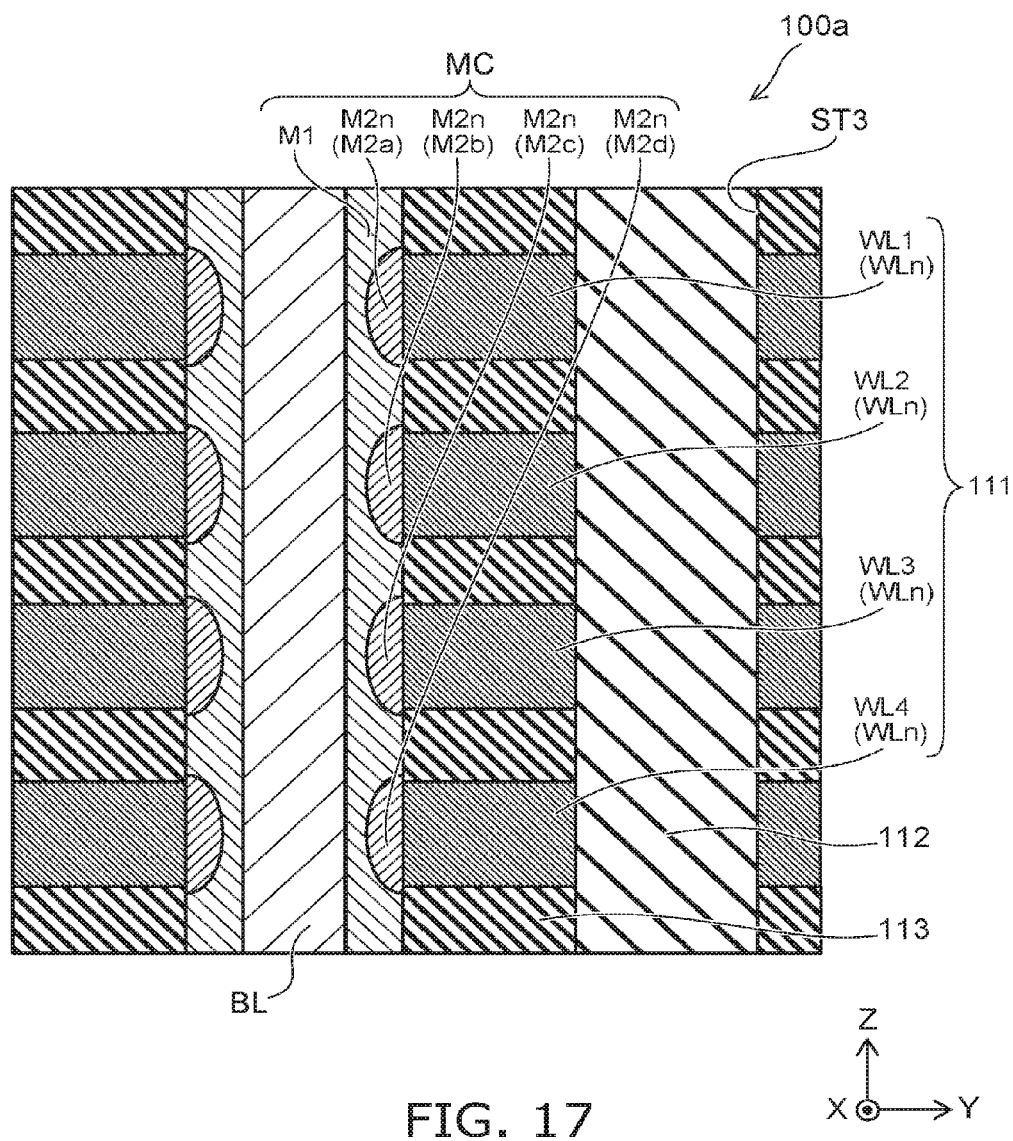
FIG. 17 is a sectional view illustrating an alternative memory device of the first embodiment.

FIG. 17 is a sectional view illustrating an alternative memory device of the first embodiment.

FIG. 17 shows a region corresponding to region 500 shown in FIG. 2.

In the alternative memory device 100a according to this embodiment, the second intermediate film M2n provided between the word line WLn and the first intermediate film M1 exists also in part of the region between the insulating film 113 and the local bit line BL. As in the first embodiment, the second intermediate film M2n is not in contact with the other second intermediate films M2n. That is, the plurality of second intermediate films M2n are provided discontinuously in the first direction (Z-direction). The rest of the configuration is similar to that of the memory device 100.

The memory device 100a can be manufactured by nearly the same process as the memory device 100. In the memory device 100a, the second intermediate film M2n is formed by adjusting the condition of reduction treatment.

(Second Embodiment)

Figure 18:
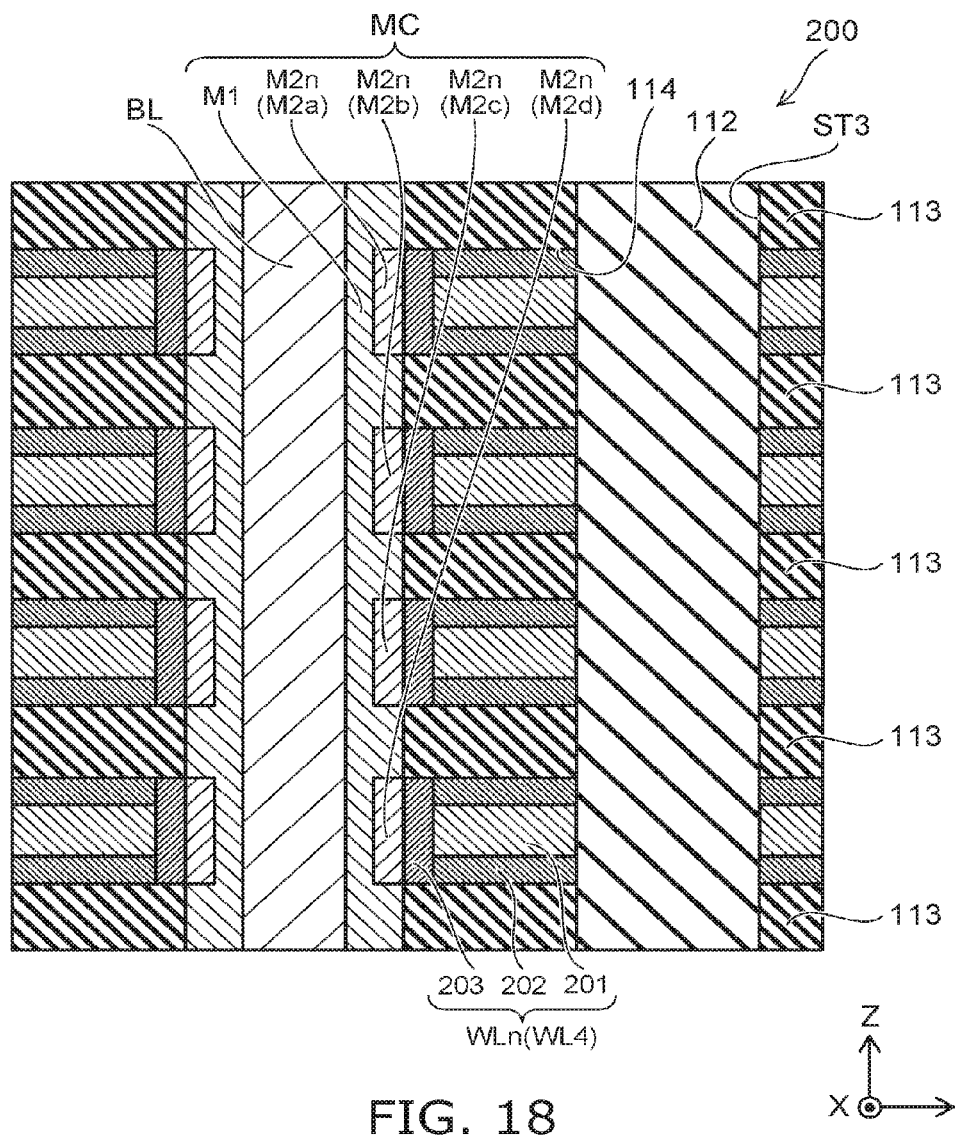
FIG. 18 is a sectional view illustrating part of a memory device according to a second embodiment.

FIG. 18 is a sectional view illustrating part of a memory device according to a second embodiment.

FIG. 18 shows a region corresponding to region 500 shown in FIG. 2.

As shown in FIG. 18, the word line WLn includes a conductive layer 201, a metal layer 202, and a third layer 203. The third layer 203 is an oxygen-deficient metal oxide layer. The metal layer 202 is provided between the conductive layer 201 and the insulating film 113. The third layer 203 is provided between the conductive layer 201 and the second intermediate film M2n. The third layer 203 includes e.g. oxygen-deficient metal oxide such as oxygen-deficient titanium oxide.

The third layer 203 may include one or more substances selected from the group consisting of oxygen-deficient hafnium oxide, oxygen-deficient tantalum oxide, oxygen-deficient zirconium oxide, and oxygen-deficient nickel oxide.

The standard electrode potential of the metal material constituting the major material of the third layer 203 is lower than the standard electrode potential of the metal material constituting the major material of the second intermediate film M2n.

The configuration other than the word line WLn of the memory device 200 according to this embodiment is similar to that of the above first embodiment.

Next, an example of the operation of the memory device according to this embodiment is described.

As in the first embodiment, the resistance state of the resistance change film MC is switched by applying a voltage to the first intermediate film M1 through a particular word line WLn and the local bit line BL. Also in the memory device 200 according to this embodiment, as in the first embodiment, when applying the reset voltage, the first voltage is applied to the local bit line BL, and the second voltage is applied to a particular word line of the word lines WLn. When applying the set voltage, the third voltage is applied to the local bit line BL, and the fourth voltage is applied to the word line.

Next, a method for manufacturing the memory device according to this embodiment is described.

Figure 19:
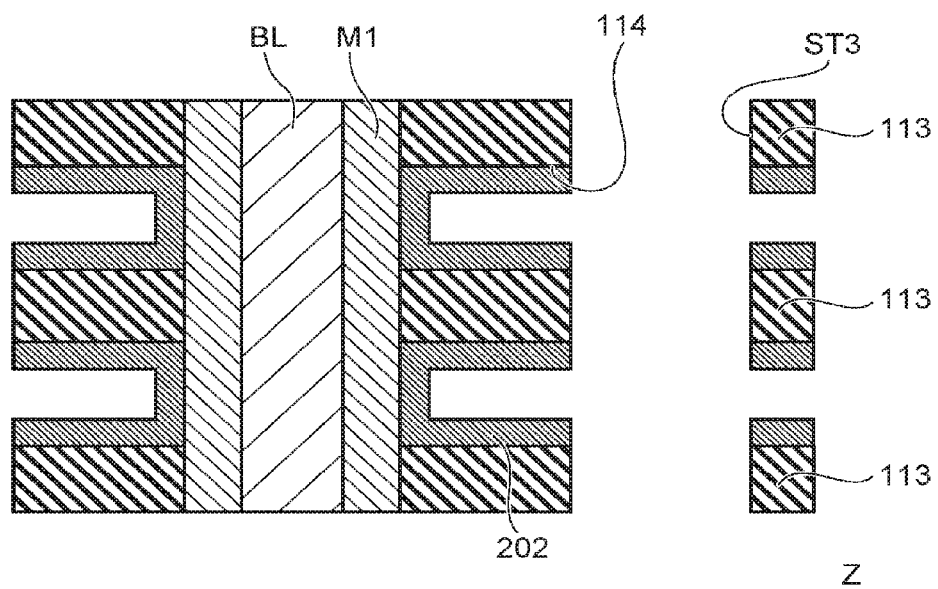
FIGS. 19 to 21 are process sectional views illustrating the method for manufacturing the memory device according to the second embodiment.
Figure 20:
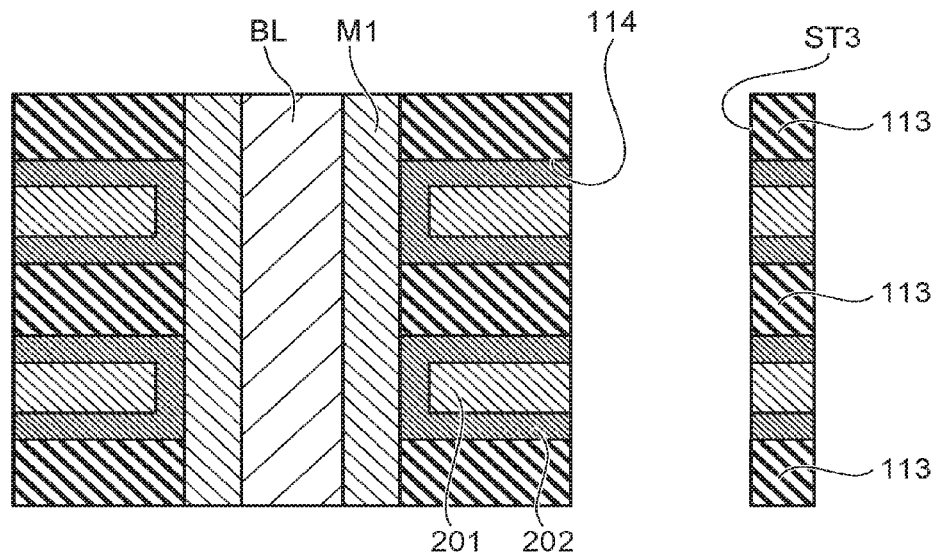
Figure 21:
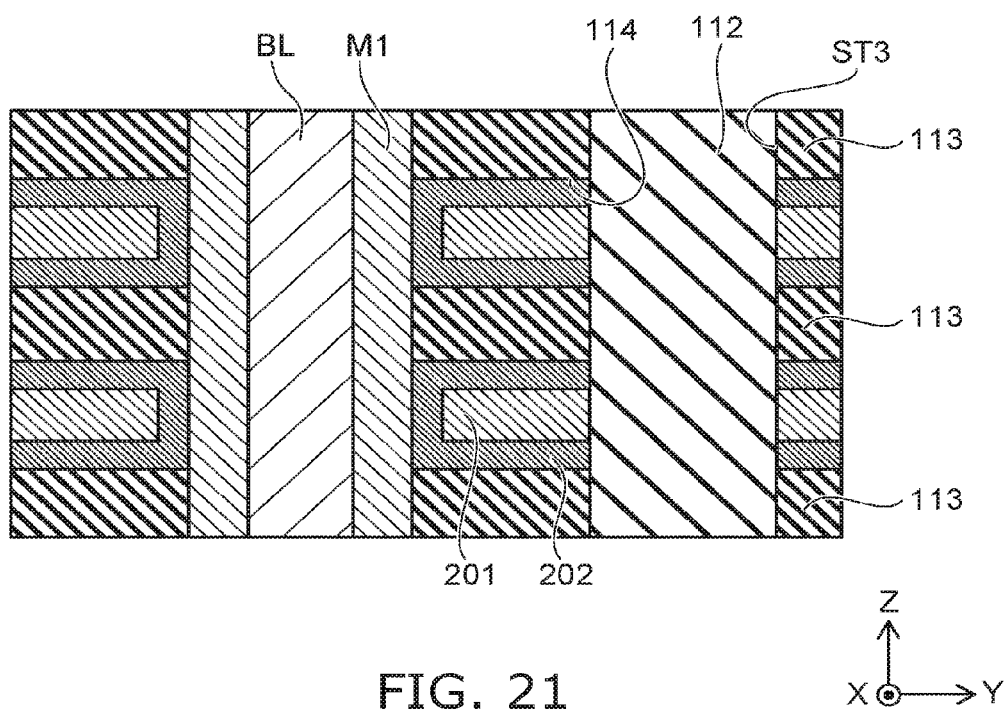

FIGS. 19 to 21 are process sectional views illustrating the method for manufacturing the memory device according to this embodiment.

FIGS. 19 to 21 show a region corresponding to region 500a shown in FIG. 9.

First, the process shown in FIGS. 5 to 13 is performed as in the first embodiment.

Then, as shown in FIG. 19, a metal layer 202 is formed on the exposed surface of the insulating film 113 and the first intermediate film M1 in the void 114 through the slit ST3. In the void 114, the metal layer 202 is in contact with the exposed surface of the first intermediate film M1.

The metal layer 202 is formed from a metal material such as titanium. The metal layer 202 may be formed from a material including one or more metals selected from the group consisting of hafnium, tantalum, zirconium, and nickel.

The metal layer 202 is formed from a metal material having a lower standard electrode potential than the metal material constituting the major material of the first intermediate film M1.

Then, as shown in FIG. 20, a conductive material such as tungsten is embedded in the void 114 through the slit ST3. Thus, a conductive layer 201 is formed.

Then, as shown in FIG. 21, an insulating material such as silicon oxide is embedded in the slit ST3. Thus, an insulating member 112 is formed in the slit ST3.

Then, as shown in FIG. 18, heat treatment is entirely performed. The heat treatment induces the scavenging effect of the metal layer 202. This moves oxygen from the first intermediate film M1 to the metal layer 202. Thus, the portion of the metal layer 202 including a surface in contact with the first intermediate film M1 constitutes a third layer 203. In each void 114, the conductive layer 201, the metal layer 202, and the third layer 203 form a word line WLn. The portion of the first intermediate film M1 in which the oxygen concentration is decreased by the scavenging effect of the metal layer 202 constitutes a second intermediate film M2n.

The memory device 200 according to this embodiment is manufactured by the foregoing process.

In this embodiment, as in the first embodiment, the plurality of second intermediate films M2n are provided discontinuously along the first direction (Z-direction). This can suppress short circuit between the word lines WLn. Furthermore, read disturb can be suppressed.

Furthermore, on the straight line parallel to the second direction (Y-direction), the thickness in the second direction (Y-direction) of the first intermediate film M1 between the word line WL and the local bit line BL is thinner than the thickness in the second direction (Y-direction) of the other portion of the first intermediate film M1. This stably forms a filament in the first intermediate film M1 between one word line WLn and the local bit line BL.

Reduction treatment is performed without using ALD, which is difficult of composition control. This can easily form a two-layer structure of the first intermediate film M1 and the second intermediate film M2n.

Furthermore, in this embodiment, the manufacturing facility can be shared with various semiconductor memory (Third Embodiment)

Figure 22:
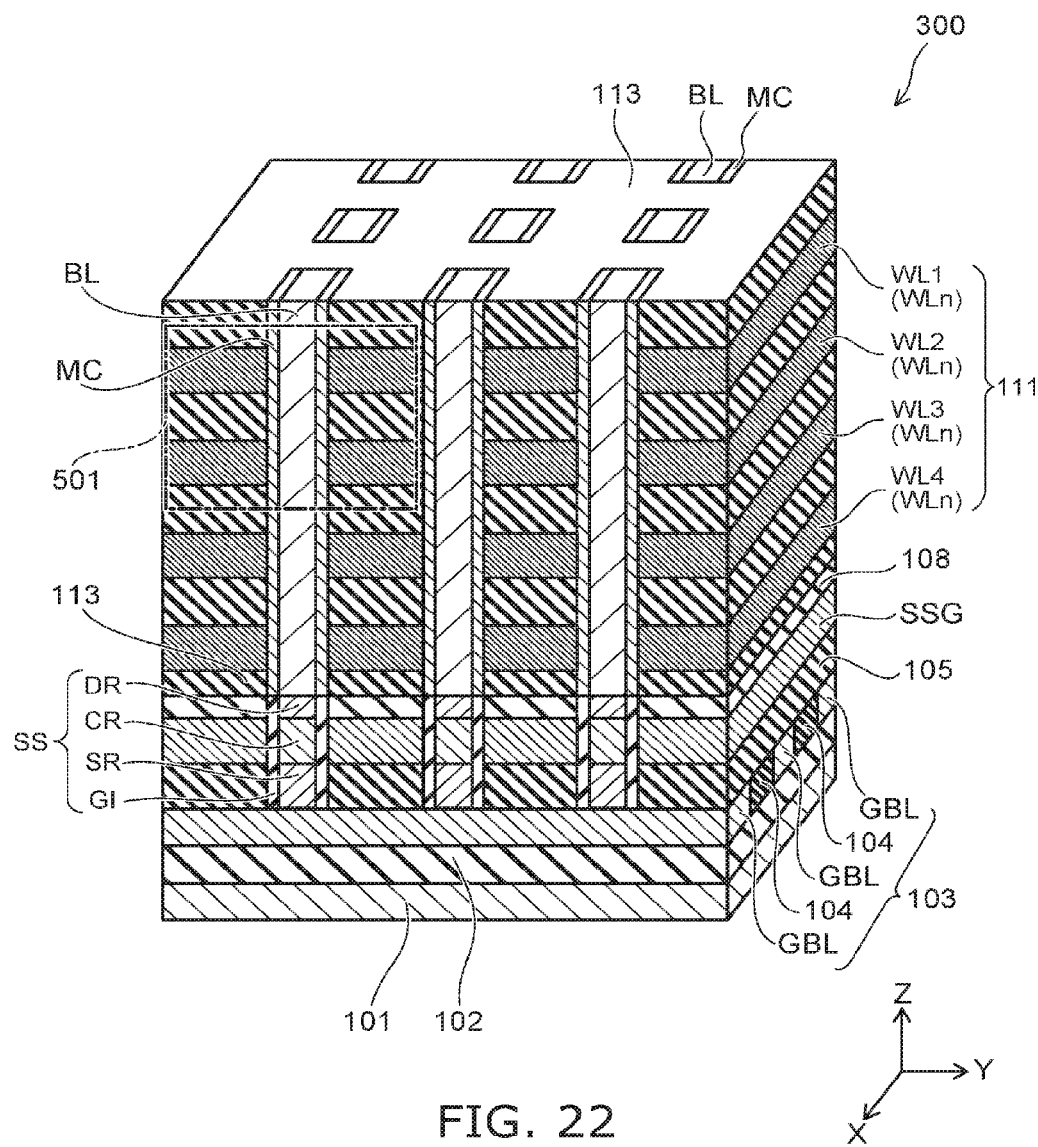
FIG. 22 is a perspective view illustrating a memory device according to a third embodiment.

FIG. 22 is a perspective view illustrating a memory device according to a third embodiment.

Figure 23:
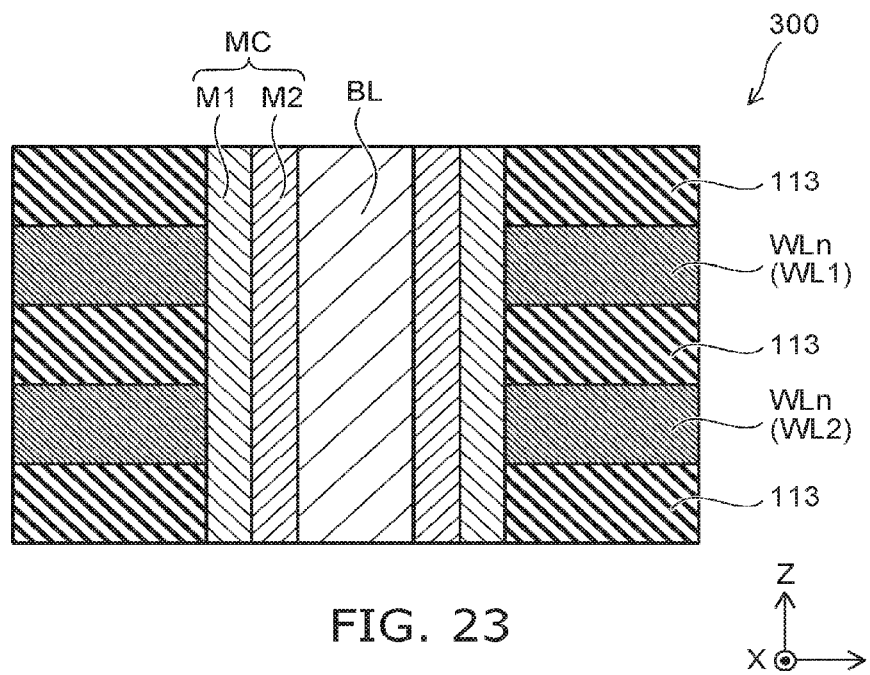
FIG. 23 is an enlarged view of region 501 shown in FIG. 22.

FIG. 23 is an enlarged view of region 501 shown in FIG. 22.

As shown in FIG. 22, the memory device 300 according to this embodiment does not include the member corresponding to the insulating member 112 in the memory device 100 according to the first embodiment. A plurality of local bit lines BL extending in the first direction (Z-direction) are electrically connected to both sides of the word line wiring layer 111 in the second direction (Y-direction). Furthermore, a plurality of select members SS are provided on both sides of the select gate electrode SSG in the second direction (Y-direction). The plurality of select members SS extend in the first direction (Z-direction). The word line wiring layer 111 includes a plurality of word lines WLn. The plurality of word lines WLn include e.g. a first word line WL1, a second word line WL2, a third word line WL3, and a fourth word line WL4. In the word line wiring layer 111, the first to fourth word lines WL1-WL4 are provided in this order from the top and apart from each other along the first direction (Z-direction).

Each word line WLn and the select gate electrode SSG are formed from a conductive material such as titanium nitride.

As shown in FIG. 23, a resistance change film MC is provided between the plurality of word lines WLn and the local bit line BL.

The resistance change film MC includes a first intermediate film M1 and a second intermediate film M2. The first intermediate film M1 is provided between the word line WLn and the local bit line BL. The second intermediate film M2 is provided between the first intermediate film M1 and the local bit line BL. The second intermediate film M2 is provided continuously along the Z-direction (first direction).

The first intermediate film M1 includes e.g. a resistance change material such as hafnium oxide. The first intermediate film M1 may include at least one selected from the group consisting of hafnium oxide, titanium oxide, tantalum oxide, zirconium oxide, and nickel oxide.

The second intermediate film M2 includes e.g. oxygen-deficient metal oxide such as oxygen-deficient hafnium oxide. The second intermediate film M2 may include at least one selected from the group consisting of oxygen-deficient hafnium oxide, oxygen-deficient titanium oxide, oxygen-deficient tantalum oxide, oxygen-deficient zirconium oxide, and oxygen-deficient nickel oxide.

The configuration other than the aforementioned configuration is similar to that of the first embodiment.

Next, an example of the operation of the memory device according to this embodiment is described.

In the memory device 300 according to this embodiment, when applying the reset voltage, a fifth voltage is applied to the local bit line BL, and a sixth voltage is applied to a particular word line WLn. The fifth voltage is lower than the sixth voltage. Then, a current flows from the word line WLn applied with the sixth voltage toward the local bit line BL applied with the fifth voltage. On the other hand, when applying the set voltage, a seventh voltage is applied to the local bit line BL, and an eighth voltage is applied to a particular word line WLn. The seventh voltage is higher than the eighth voltage. Then, a current flows from the local bit line BL applied with the seventh voltage toward the word line WLn applied with the eighth voltage.

Next, an example of a method for manufacturing the memory device according to this embodiment is described.

Figure 24:
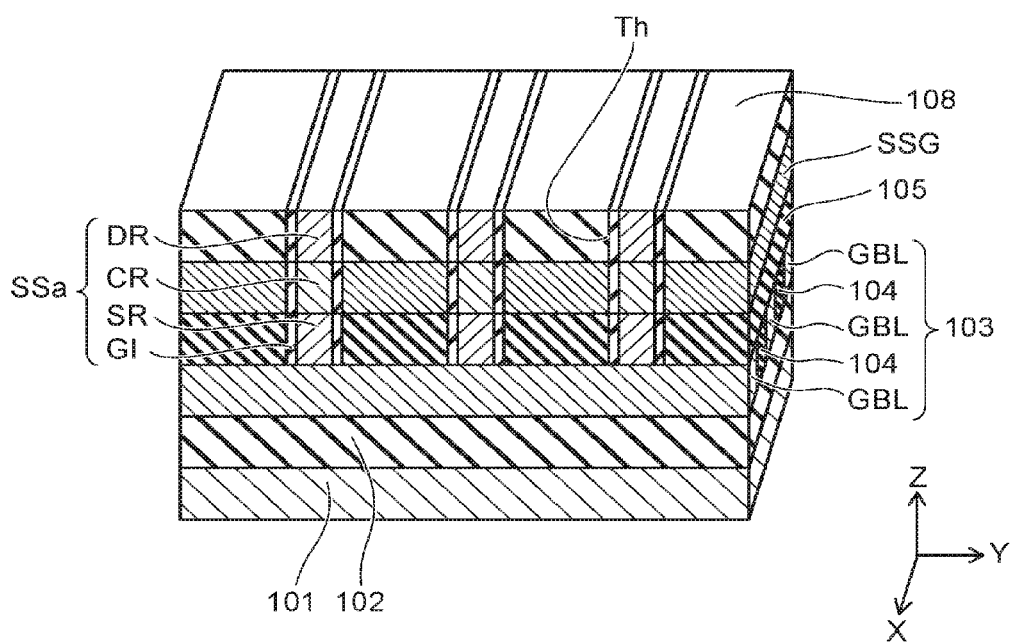
FIGS. 24 and 25 are perspective views illustrating the method for manufacturing the memory device according to a third embodiment.
Figure 25:
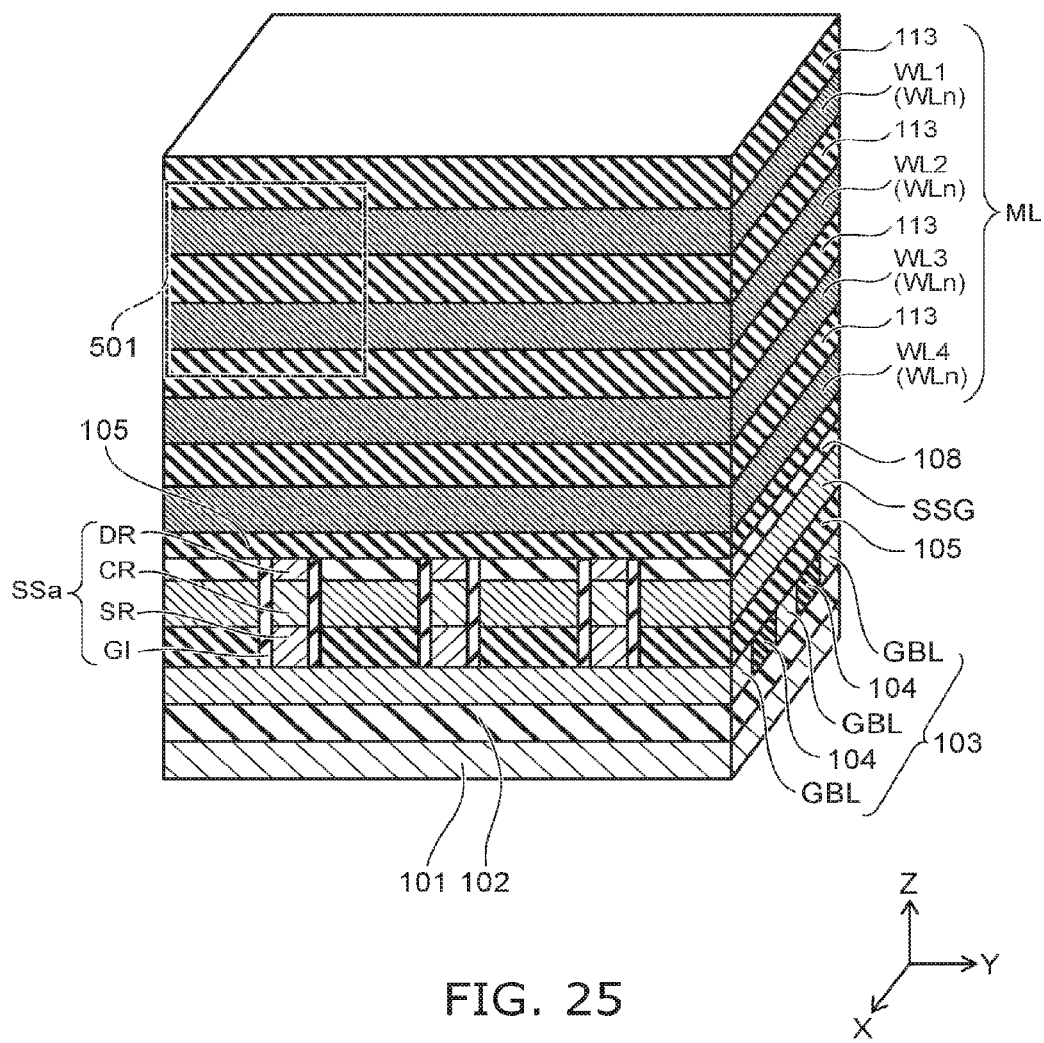

FIGS. 24 and 25 are perspective views illustrating the method for manufacturing the memory device according to this embodiment.

Figure 26:
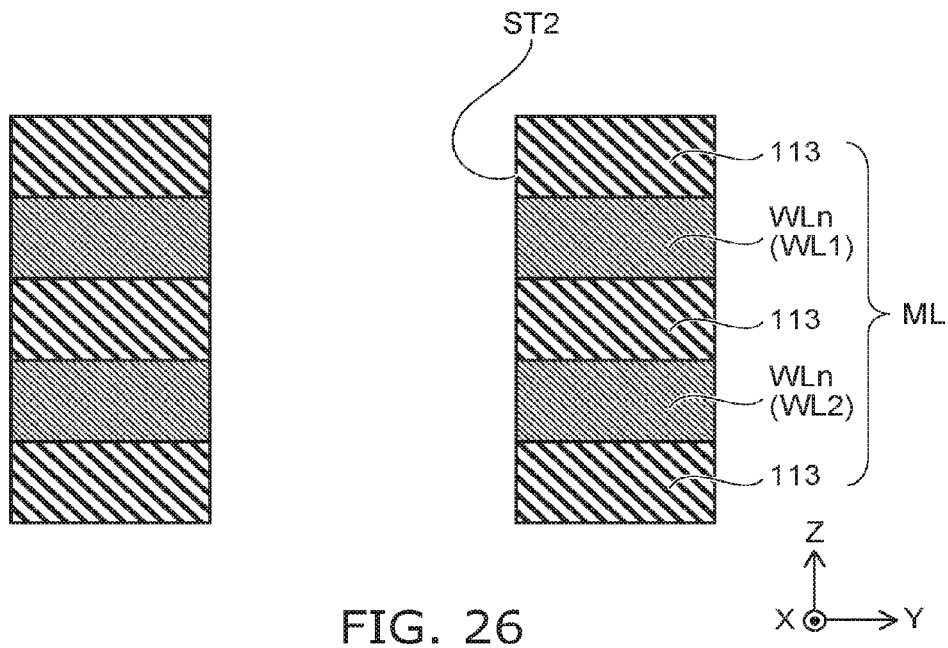
FIGS. 26 to 28 are process sectional views illustrating the method for manufacturing the memory device according to the third embodiment.
Figure 27:
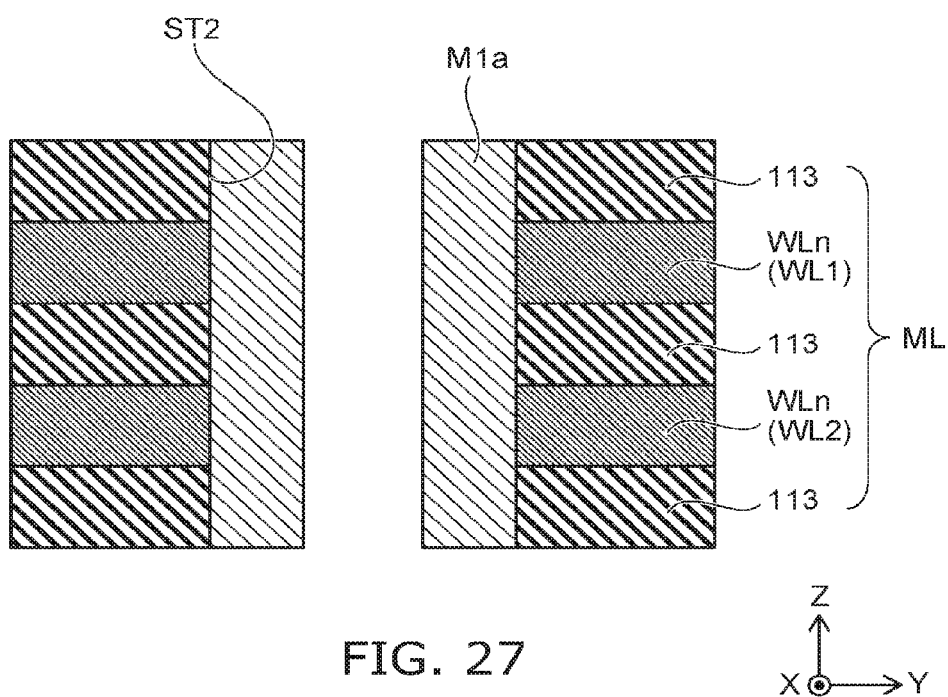
Figure 28:
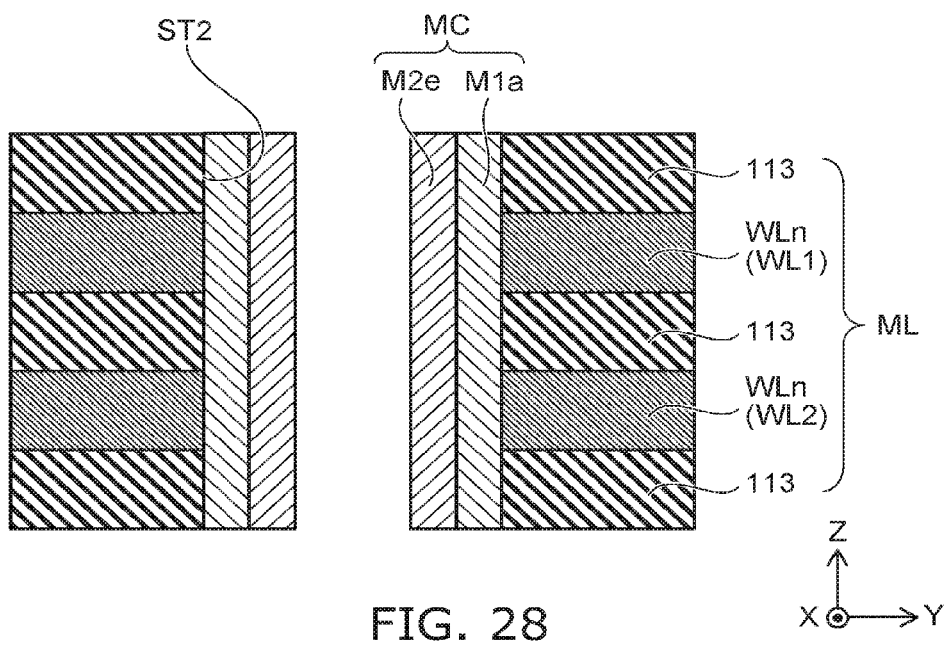

FIGS. 26 to 28 are process sectional views illustrating the method for manufacturing the memory device according to this embodiment.

FIGS. 26 to 28 correspond to region 501 shown in FIG. 25.

First, the process shown in FIGS. 5 and 7 is performed as in the first embodiment.

Then, as shown in FIG. 24, an insulating film 105 is formed at the bottom of the trench part Th. At this time, the upper surface of the insulating film 105 is formed nearly at the same position in the Z-direction as the interface between the source portion SR and the channel portion CR. A select gate electrode SSG is formed on the insulating film 105. The upper surface of the select gate electrode SSG is formed nearly at the same position in the Z-direction as the interface between the channel portion CR and the drain portion DR. An insulating film 108 is formed on the select gate electrode SSG. The upper surface of the insulating film 108 is formed nearly at the same position in the Z-direction as the upper surface of the drain portion DR.

Then, as shown in FIG. 25, a plurality of insulating films 113 and a plurality of word lines WLn are stacked alternately one by one on the insulating film 108. Thus, a stacked body ML including a plurality of insulating films 113 and a plurality of word lines WLn is formed on the insulating film 108. For instance, the insulating film 113 is formed from a material including silicon oxide.

Then, as shown in FIG. 26, a slit ST2 penetrating through the stacked body ML is formed directly above the select member SSa. Although not shown, the slit ST2 is extended to the upper surface of the select member SSa. The slit ST2 is shaped like a trench extending along the along the third direction (X-direction). That is, the width in the second direction (Y-direction) of the slit ST2 is narrower than the width in the third direction (X-direction).

Then, as shown in FIG. 27, a resistance change material such as hafnium oxide is deposited. Then, etch-back treatment is performed. Thus, the resistance change material deposited on the stacked body ML and the bottom of the slit ST2 is removed. At this time, the resistance change material is left on the exposed surface of the stacked body ML in the slit ST2. Thus, the resistance change material left in the slit ST2 constitutes a first intermediate film M1a.

The first intermediate film M1a may be formed from one or more resistance change materials selected from the group consisting of hafnium oxide, titanium oxide, tantalum oxide, zirconium oxide, and nickel oxide.

Then, as shown in FIG. 28, reduction treatment is performed on the portion including the surface of the first intermediate film M1a in the slit ST2. The portion of the first intermediate film M1 subjected to the reduction treatment constitutes a second intermediate film M2e. Thus, in the slit ST2, a second intermediate film M2e is formed on the first intermediate film M1a.

Then, as shown in FIGS. 22 and 23, a semiconductor material such as polysilicon is embedded in the slit ST2 to form a local bit line BL. The local bit line BLa is electrically connected to the select member SSa. At this time, the local bit line BLa and the select member SSa are shaped like a plate extending along the third direction (X-direction). That is, the width in the second direction (Y-direction) of the local bit line BLa and the select member SSa is narrower than the width in the third direction (X-direction).

The local bit line BLa and the select member SSa are electrically connected to a plurality of global bit lines GBL. The first intermediate film M1a, the second intermediate film M2e, the local bit line BLa, and the select member SSa each include a portion directly above the insulating film 104.

Then, the local bit line BLa and the select member SSa directly above the insulating film 104 are selectively removed by anisotropic etching such as RIE. At this time, the portion of the local bit line BLa and the select member SSa not directly above the insulating film 104 is not removed. Accordingly, a columnar recess is formed. Thus, the first intermediate film M1a, the second intermediate film M2e, the local bit line BLa, and the select member SSa are divided and processed into columns. By this processing, the first intermediate film M1a constitutes a first intermediate film M1. The second intermediate film M2e constitutes a second intermediate film M2. The local bit line BLa constitutes a local bit line BL. The select member SSa constitutes a select member SS. The local bit line BL and the select member SS are electrically connected to one global bit line GBL. Then, an insulating material including silicon oxide is embedded in the columnar recess. This insulating material constitutes part of the insulating film 113.

The memory device 300 according to this embodiment is manufactured by the foregoing process.

In this embodiment, the second intermediate film M2 is provided between the first intermediate film M1 and the local bit line BL. That is, the second intermediate film M2 having a lower resistance than the first intermediate film M1 is electrically connected to the word line WLn through the first intermediate film M1. This can suppress short circuit between the word lines WLn. Furthermore, the occurrence of read disturb can be suppressed.

Furthermore, in this embodiment, after the first intermediate film M1 is formed in the slit ST2, the upper portion of the first intermediate film M1 is subjected to reduction treatment. Thus, a second intermediate film M2 is formed on the first intermediate film M1. Accordingly, the second intermediate film M2 can be formed without using the ALD process, which is difficult of composition control. This can easily form the second intermediate film M2.

(Fourth Embodiment)

Figure 29:
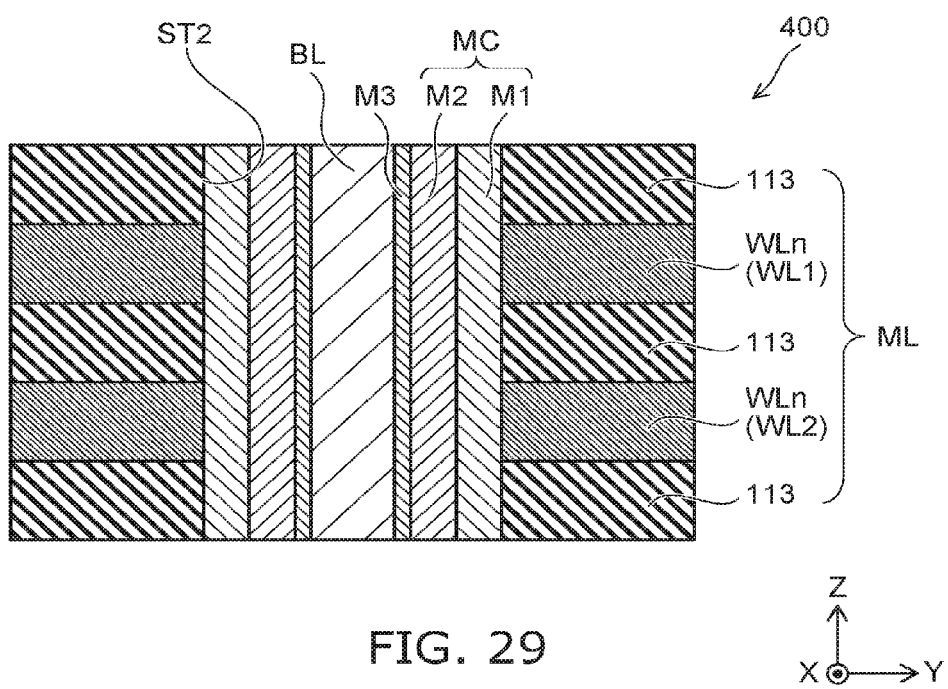
FIG. 29 is an enlarged view of the region corresponding to region 501 shown in FIG. 22 of a memory device according to a forth embodiment.

FIG. 29 is an enlarged view of the region corresponding to region 501 shown in FIG. 22 of a memory device according to this embodiment.

In the memory device 400 according to this embodiment, as shown in FIG. 29, word lines WLn are stacked in the first direction (Z-direction). An insulating film 113 is provided between the word lines WLn. A first intermediate film M1 is provided between the word lines WLn and insulating films 113 on one hand and the local bit line BL on the other. A second intermediate film M2 is provided between the first intermediate film M1 and the local bit line BL. A third layer M3 is provided between the second intermediate film M2 and the local bit line BL.

The configuration other than the configuration including the third layer M3 between the local bit line BL and the second intermediate film M2 is similar to that of the third embodiment.

Next, an example of the operation of this embodiment is described.

In the memory device 400 according to this embodiment, as in the third embodiment, the fifth voltage is applied to the local bit line BL, and the sixth voltage is applied to a particular word line WLn. On the other hand, when applying the set voltage, the seventh voltage is applied to the local bit line BL, and the eighth voltage is applied to a particular word line WLn.

Next, an example of a method for manufacturing the memory device according to this embodiment is described.

Figure 30:
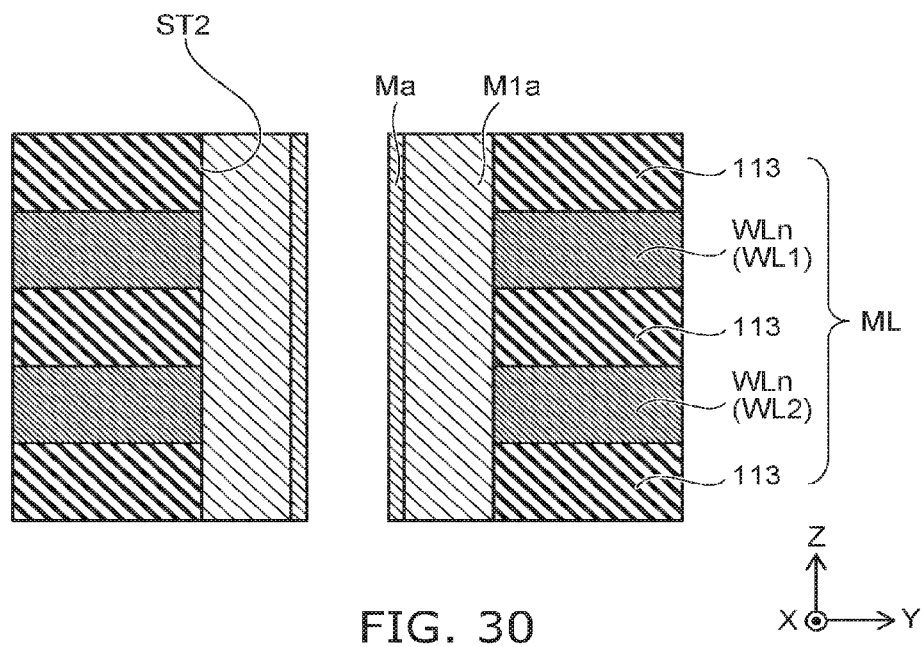
FIGS. 30 and 31 are process sectional views illustrating the method for manufacturing the memory device according to the forth embodiment.
Figure 31:
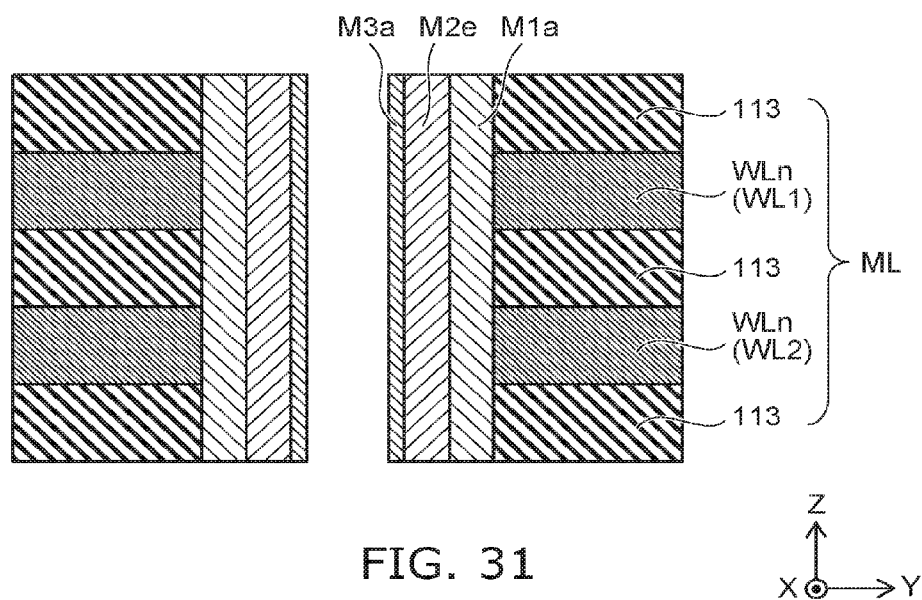

FIGS. 30 and 31 are process sectional views illustrating the method for manufacturing the memory device according to this embodiment.

FIGS. 30 and 31 show a region correspond to region 501 shown in FIG. 25.

First, the process shown in FIGS. 5, 7, and 24 to 26 is performed as in the third embodiment.

Then, as shown in FIG. 30, a metal layer Ma is formed on the first intermediate film M1a. The metal layer Ma is formed from a metal material such as titanium. The metal layer Ma may be formed from a material including one or more metals selected from the group consisting of hafnium, tantalum, zirconium, and nickel.

The metal layer Ma is formed from a metal material having a lower standard electrode potential than the metal material constituting the major material of the first intermediate film M1.

Then, as shown in FIG. 31, heat treatment is entirely performed. The heat treatment induces the scavenging effect of the metal layer Ma. This moves oxygen from the first intermediate film M1a to the metal layer Ma. Thus, in the slit ST2, the upper part of the first intermediate film M1 including a surface in contact with the metal layer Ma constitutes a second intermediate film M2. The metal layer Ma constitutes a third layer M3a.

Then, as shown in FIG. 29, a semiconductor material such as polysilicon is embedded in the slit ST2 to form a local bit line BLa. The local bit line BLa is connected to the select member SSa. At this time, the local bit line BLa and the select member SSa are shaped like a plate extending along the third direction (X-direction). That is, the width in the second direction (Y-direction) of the local bit line BL and the select member SSa is narrower than the width in the third direction (X-direction). At this time, the local bit line BLa is electrically connected to a plurality of global bit lines GBL through the select member SSa. The third layer M3a, the second intermediate film M2a, the first intermediate film M1a, the local bit line BLa, and the select member SSa each include a portion directly above the insulating film 104.

Then, the third layer M3a, the second intermediate film M2a, the first intermediate film M1a, the local bit line BLa, and the select member SSa directly above the insulating film 104 are removed by anisotropic etching such as RIE. At this time, the portion of the third layer M3a, the second intermediate film M2a, the first intermediate film M1a, the local bit line BLa, and the select member SSa not directly above the insulating film 104 is not removed. Accordingly, a columnar recess is formed. Thus, the third layer M3a, the first intermediate film M1a, the second intermediate film M2a, the local bit line BLa, and the select member SSa are divided and processed into columns. By this processing, the third layer M3a constitutes a third layer M3. The second intermediate film M2a constitutes a second intermediate film M2. The first intermediate film M1a constitutes a first intermediate film M1. The local bit line BLa constitutes a local bit line BL. The select member SSa constitutes a select member SS. The local bit line BL and the select member SS are electrically connected to one global bit line GBL. Then, an insulating material including silicon oxide is embedded in the columnar recess. This insulating material constitutes part of the insulating film 113.

The memory device 400 according to this embodiment is manufactured by the foregoing process.

In this embodiment, as in the third embodiment, the second intermediate film M2 having a lower resistance than the first intermediate film M1 is electrically connected to the word line WLn through the first intermediate film M1. This can suppress short circuit between the word lines WLn. Furthermore, the occurrence of read disturb can be suppressed.

In this embodiment, after the first intermediate film M1 is formed in the slit ST2, the upper portion of the first intermediate film M1 is reduced by the scavenging effect of the metal layer Ma. Thus, a second intermediate film M2 is formed on the first intermediate film M1. Accordingly, the second intermediate film M2 can be formed without using the ALD process, which is difficult of composition control.

The embodiments described above can realize a memory device having high read disturb immunity and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device comprising:
a pillar extending in a first direction;
a first wiring apart from the pillar in a second direction crossing the first direction, the first wiring extending in a third direction crossing the first direction and the second direction;
a second wiring apart from the first wiring in the first direction and extending in the third direction;
an insulating film provided between the first wiring and the second wiring;
a first layer provided between the first wiring and the pillar in the second direction and including a first metal oxide containing a first metal and oxygen;
a second layer provided between the second wiring and the pillar in the second direction and including the first metal oxide containing the first metal and oxygen;
an intermediate film provided between the pillar and the first layer in the second direction and between the pillar and the second layer in the second direction, intermediate film including a second metal oxide containing the first metal and oxygen,
a concentration of oxygen contained in the first metal oxide being lower than a concentration of oxygen contained in the second metal oxide; and
a metal film provided at a first position between the first wiring and the insulating film and a second position between the second wiring and the insulating film.

2. The device according to claim 1, wherein an amount of oxygen deficiency per a unit volume in the first layer is larger than an amount of oxygen deficiency per the unit volume in the intermediate film, and an amount of oxygen deficiency per the unit volume in the second layer is larger than the amount of oxygen deficiency per the unit volume in the intermediate film.

3. The device according to claim 1, wherein the first metal includes at least one selected from the group consisting of hafnium, titanium, tantalum, zirconium, and nickel.

4. The device according to claim 1, wherein a first thickness of the intermediate film between the pillar and the first wiring in the second direction on a straight line parallel to the second direction is thinner than a second thickness of the intermediate film between the pillar and the insulating film in the second direction on the straight line.

5. The device according to claim 1, wherein the metal film includes at least one selected from the group consisting of hafnium, titanium, tantalum, zirconium, and nickel.

6. The device according to claim 1, further comprising:
a third layer provided between the first wiring and the first layer and between the second wiring and the second layer,
wherein the third layer includes a third metal oxide containing a second metal and oxygen.

7. The device according to claim 6, wherein the second metal includes at least one selected from the group consisting of hafnium, titanium, tantalum, zirconium, and nickel.

8. The device according to claim 6, wherein a standard electrode potential of the second metal is lower than a standard electrode potential of the first metal.

* * * * *